United States Patent
Reykowski et al.

(10) Patent No.: US 7,098,659 B2
(45) Date of Patent: Aug. 29, 2006

(54) METHOD FOR MODE FORMATION, METHOD FOR MODE PROVISION, AND RECEPTION UNIT FOR A MAGNETIC RESONANCE DEVICE

(75) Inventors: Arne Reykowski, Erlangen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/685,883

(22) Filed: Oct. 15, 2003

(65) Prior Publication Data

US 2004/0193038 A1 Sep. 30, 2004

(30) Foreign Application Priority Data

Mar. 24, 2003 (DE) ................ 103 13 004

(51) Int. Cl.
*G01V 3/00* (2006.01)
(52) U.S. Cl. .................................. 324/309
(58) Field of Classification Search ............... 324/307, 324/309, 318, 322
See application file for complete search history.

(56) References Cited

U.S. PATENT DOCUMENTS

| | | | |
|---|---|---|---|
| 4,339,716 A * | 7/1982 | Young ................. | 324/309 |
| 4,682,112 A * | 7/1987 | Beer .................... | 324/322 |
| 4,825,162 A | 4/1989 | Roemer et al. | |
| 4,945,321 A | 7/1990 | Oppelt et al. | |
| 5,327,898 A * | 7/1994 | Yoshino et al. ........ | 600/422 |
| 5,345,172 A * | 9/1994 | Taguchi et al. ........ | 324/309 |
| 5,471,142 A | 11/1995 | Wang | |
| 5,543,711 A * | 8/1996 | Srinivasan et al. ..... | 324/318 |
| 5,594,337 A * | 1/1997 | Boskamp .............. | 324/318 |
| 5,619,138 A * | 4/1997 | Rourke ................. | 324/309 |
| 5,910,728 A * | 6/1999 | Sodickson ............ | 324/309 |
| 6,400,157 B1 * | 6/2002 | Bonanni et al. ........ | 324/322 |
| 6,476,606 B1 * | 11/2002 | Lee ..................... | 324/309 |
| 6,486,828 B1 * | 11/2002 | Cahn et al. ............ | 342/363 |
| 6,686,737 B1 * | 2/2004 | Kruspe et al. ......... | 324/303 |
| 6,825,660 B1 * | 11/2004 | Boskamp .............. | 324/318 |

OTHER PUBLICATIONS

"Taschenbuch der Hochfrequenztechnik," Lange et al (1986) p. N56.

* cited by examiner

*Primary Examiner*—Diego Gutierrez
*Assistant Examiner*—Dixomara Vargas
(74) *Attorney, Agent, or Firm*—Schiff Hardin LLP

(57) ABSTRACT

A reception unit for an MR device with at least two local antennas has a combination network to which the antennas are connected separately for combination of the antenna signals. The combination network generates at least two different modes that are linear combinations of the antenna signals, and at least two of which are present at an output of the combination network.

38 Claims, 16 Drawing Sheets

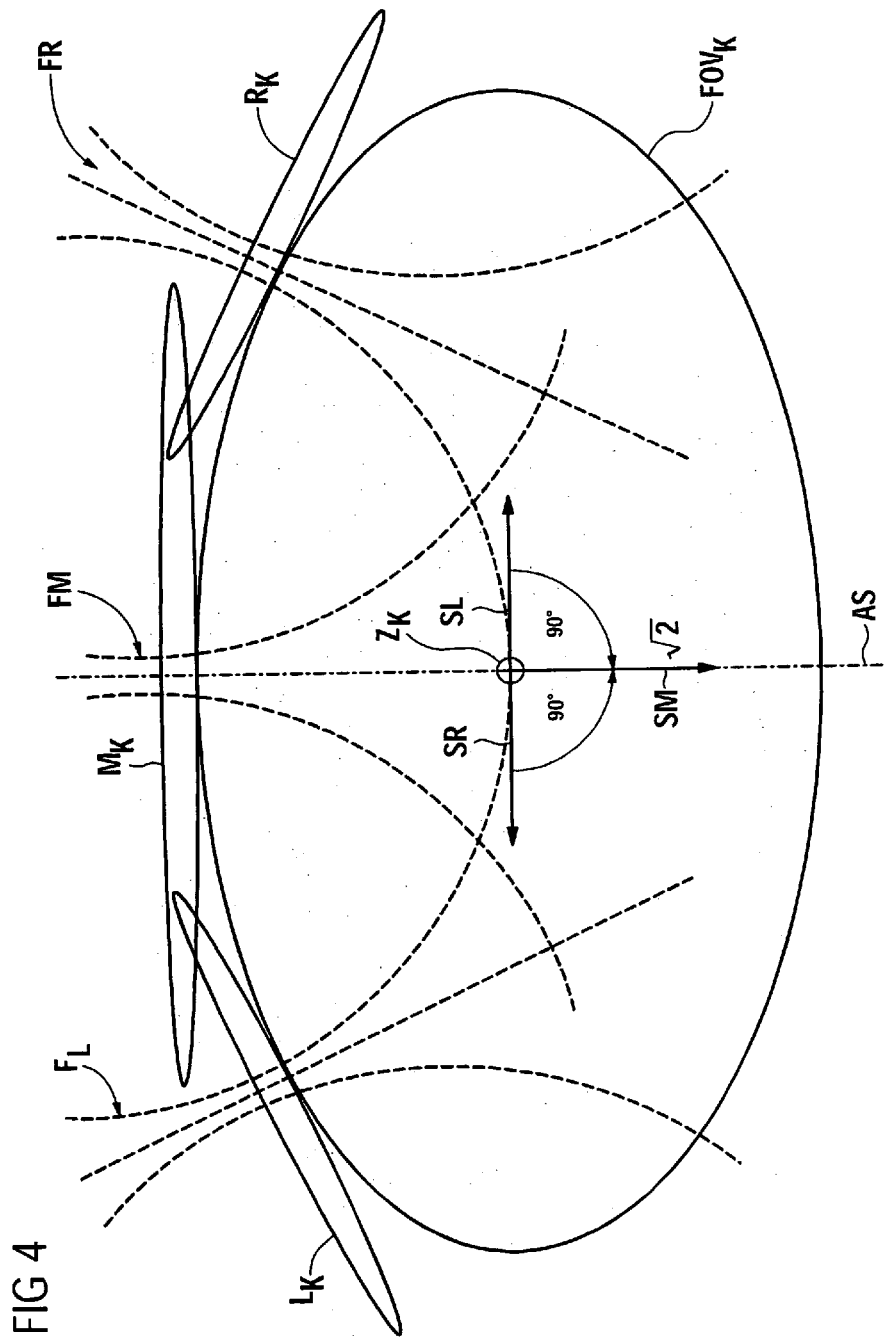

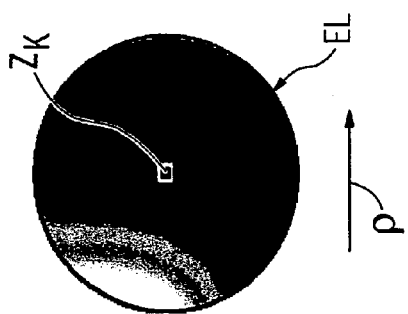
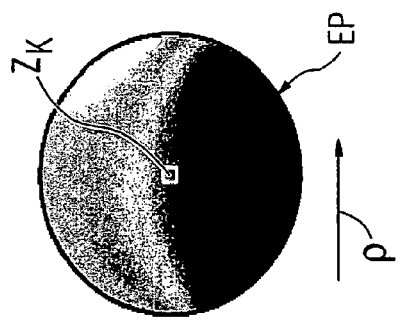
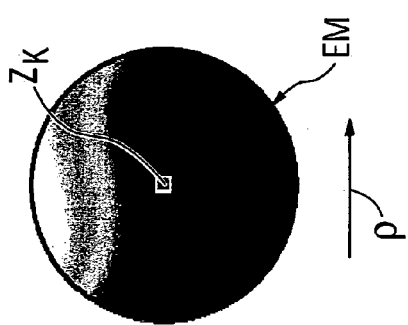
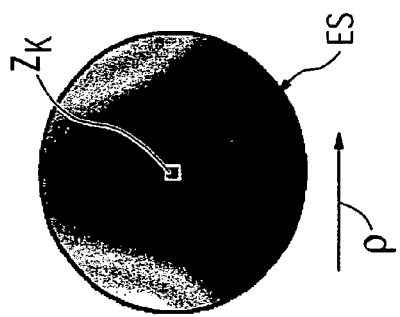
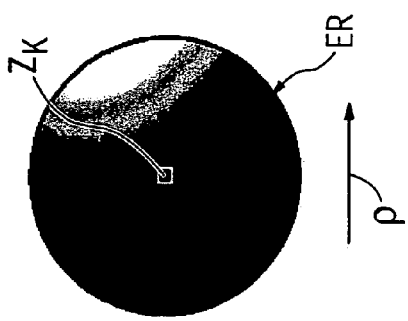
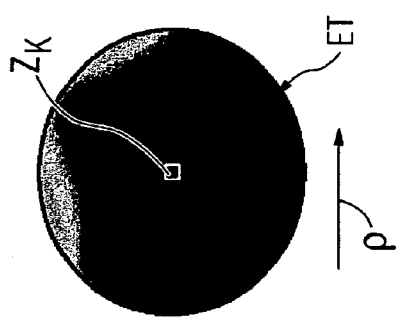

$$\begin{bmatrix} P \\ S \\ T \end{bmatrix} = \begin{bmatrix} p_1 & p_2 & p_3 \\ s_1 & s_2 & s_3 \\ t_1 & t_2 & t_3 \end{bmatrix} \cdot \begin{bmatrix} R \\ M \\ L \end{bmatrix} = \begin{bmatrix} p_1 & p_2 & p_3 \\ s_1 & s_2 & s_3 \\ t_1 & t_2 & t_3 \end{bmatrix} \cdot \mathbf{I}$$

FIG 10
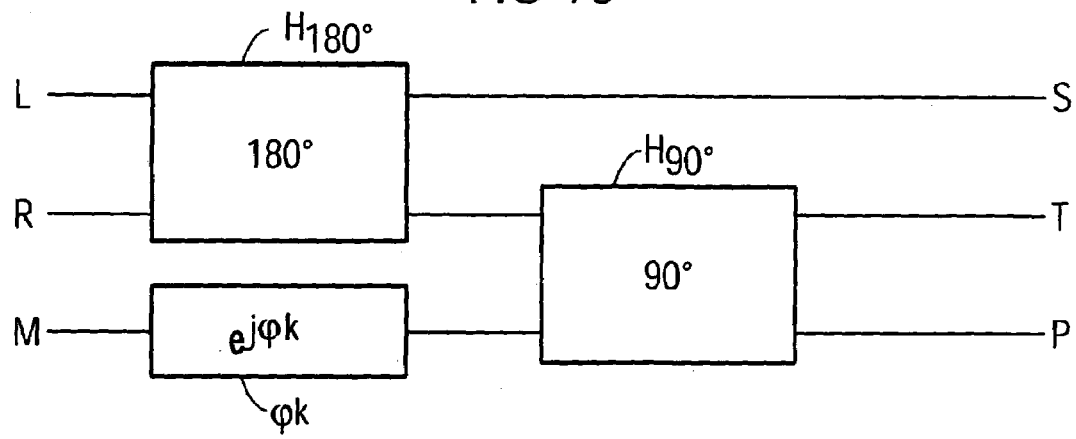
FIG 11
$$\begin{bmatrix} P \\ S \\ T \end{bmatrix} = \begin{bmatrix} \frac{1}{2} & -\frac{j}{\sqrt{2}} & -\frac{1}{2} \\ \frac{1}{\sqrt{2}} & 0 & \frac{1}{\sqrt{2}} \\ \frac{1}{2} & \frac{j}{\sqrt{2}} & -\frac{1}{2} \end{bmatrix} \cdot \begin{bmatrix} R \\ M \\ L \end{bmatrix}$$
FIG 12
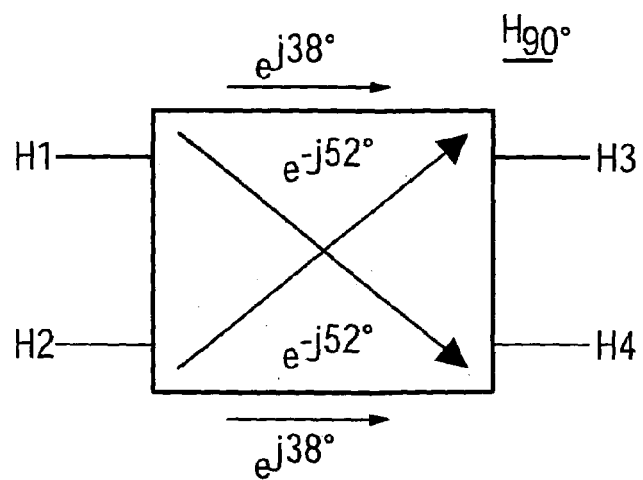

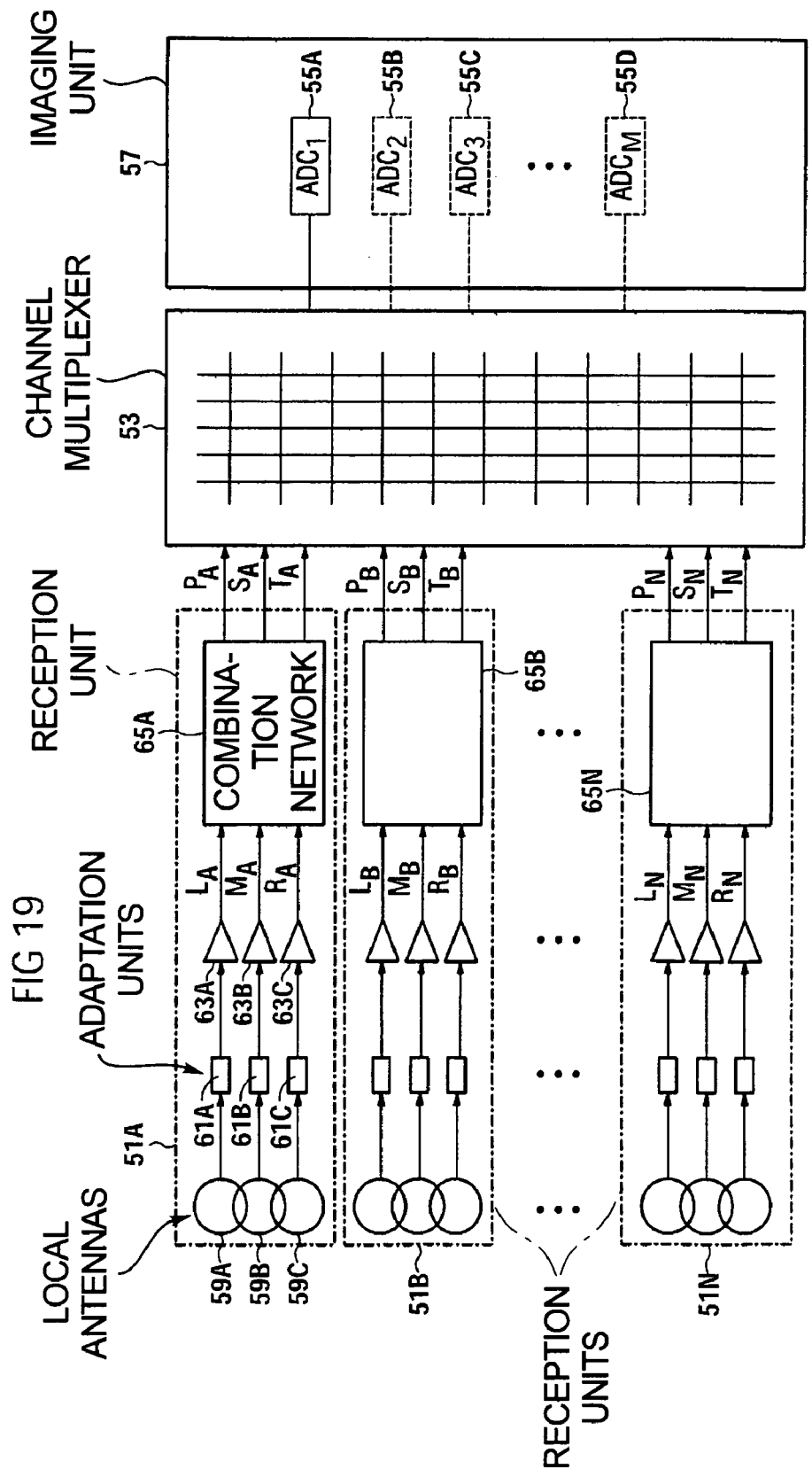

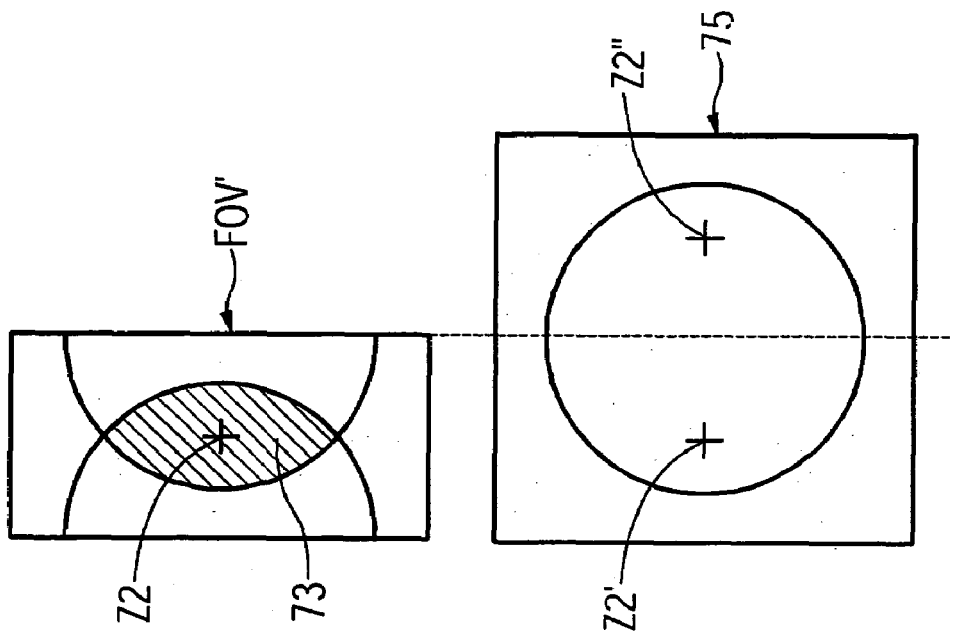
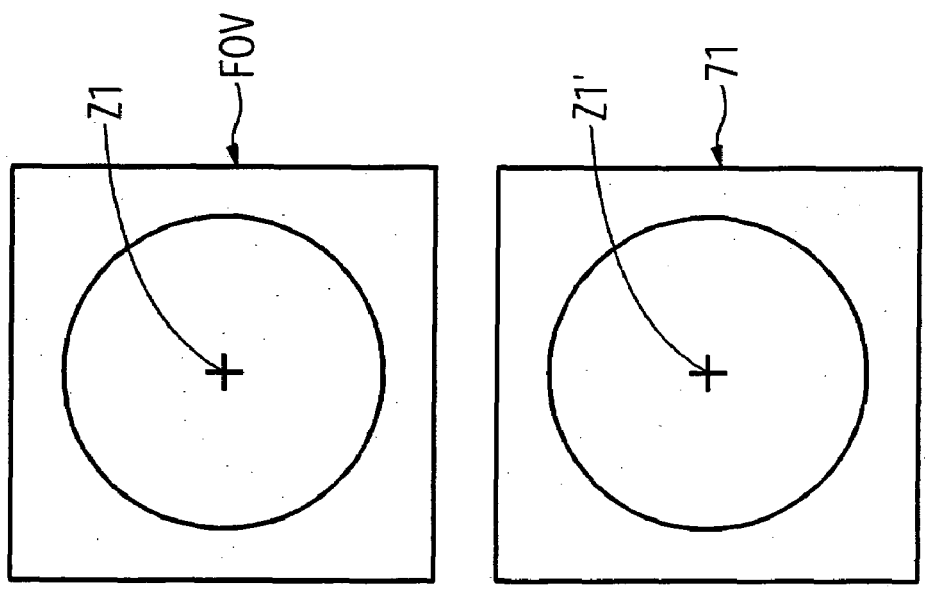

METHOD FOR MODE FORMATION, METHOD FOR MODE PROVISION, AND RECEPTION UNIT FOR A MAGNETIC RESONANCE DEVICE

BACKGROUND OF THE INVENTION

1. Field of the Invention

The invention concerns a method for mode formation from at least two magnetic resonance response signals. The invention also concerns a method for mode provision for magnetic resonance imaging. Furthermore, the invention concerns of a reception unit for a magnetic resonance device with at least two local antennas that are respectively connected separately to a combination network to combine the antenna signals.

2. Description of the Prior Art

Parallel imaging techniques (Parallel Acquisition Techniques PAT) are used in magnetic resonance tomography (MR tomography) to reduce the image acquisition time. In such techniques, information regarding the locations of respective signal-receiving local antennas is used for image reconstruction. Given an arrangement of N local antennas, the image acquisition time can be maximally shortened by an acceleration factor N. The number of the local antennas used is thus always larger than or equal to the achieved acceleration factor. A reception channel of an MR imaging unit is necessary for each local antenna that is used.

If multiple local antennas are used in a parallel imaging method, and if the maximum acquisition region (Field Of View FOV) of the local antennas is scanned, a reception channel is thus necessary for each local antenna that is used, also in the case of no accelerated imaging being implemented.

An arrangement of local antennas is known from German OS 4,232,827. The arrangement formed as an array with at least three linearly polarized local coils that mutually overlap insofar as that they are geometrically decoupled, and each local coil is separately connected to a combination network in which a complex linkage is produced among the output signals respectively from three local coils, such that one MR signal is acquired that corresponds to a circular polarization.

A method for MR imaging is known from U.S. Pat. No. 4,825,162. In this method, an array of surface coils is first provided, with the surface coils positioned such that they exhibit no mutual interaction. An MR response signal, which originates from a part of the probe that is located in the acquisition region, is received by each coil. An MR image is formed from each MR response signal, and the MR images are combined with one another on a pixel-by-pixel basis in order to generate a single common MR image.

The topic of the phase-controlled group antenna is, for example, explained in "Taschenbuch der Hochfrequenztechnik", Springerverlag 1986. In a supply network of the group antenna, phase shifters and delay elements are used that change the amplitudes and phases of the individual radiation emissions before their superimposition and influence the directional characteristics of the group antenna.

A PI/2 power element is known from European Application 03 37 194 that divides an input signal into two signal paths with equal amplitude and 90° phase shifting.

SUMMARY OF THE INVENTION

An object of the present invention is to provide a method for mode formation, a method for provision of modes, and a reception unit for an MR device, which enable a flexible and simplified use of local antennas, for example in parallel imaging.

The first cited object is inventively achieved in a method for forming at least two modes from at least two MR response signals that are received with at least two local antennas. A primary mode is generated by a weighted linear combination of the MR response signals such that the primary mode, corresponding to an MR signal of an amplitude- and phase-controlled group antenna that exhibits a first sensitivity distribution that is optimized for a first target region within the detection volume of the local antennas. A secondary mode is generated by a second weighted linear combination of the MR response signal such that the secondary mode, corresponding to an MR signal of an amplitude- and phase-controlled group antenna that exhibits a second sensitivity distribution that is different from the first sensitivity distribution in the phase coding direction of the MR response signal.

The term "mode" denotes in connection with one ore more antennas of an MR device, a distribution of the sensitivity in the antenna field as a function of the space. An analog output signal that can be further processed as an MR response signal from an MR scan associated with a mode. "Linear combination of the MR response signal," for example, falls under the concept of the formation of a sum of a number of MR response signals, whereby each MR response signal can be phase-shifted and entered with a weighting into the sum. A phase-shifting of 180° in the sum of two signals then corresponds, for example, to a difference signal of the two signals. In the extreme case of a linear combination, all signals but one can be entered with a null weighting into the linear combination, such that the ensuing mode corresponds to that of an MR response signal that may eventually be further phase-shifted. In the normal case, at least two MR response signals are linearly combined with one another.

The sensitivity distribution of a local antenna is relevant to the signal-to-noise ratio in the acquisition region. This is also true for a sensitivity distribution of a mode that, for example, relates to the acquisition regions of the local antennas contributing to the linear combination. Since the acquisition regions of the local antennas overlap in the region to be examined, for the most part only an acquisition region, that is herein designated as a detection volume of the local antennas, or as a field of view of the local antennas, is discussed, The primary mode formation preferably is undertaken in a manner to improve (meaning optimize) the sensitivity in comparison with the sensitivities of the local antennas. The primary mode can be understood as a type of base mode fundamental mode that can be processed into an MR image that, by itself, represents an improvement in comparison to MR images that are acquired from individual MR antenna signals. This improvement ensues in particular in the first target region of the detection volume in which, for example, the signal-to-noise ratio is increased, by the sensitivity being optimized, for example for circularly polarized magnetic resonance signals.

The secondary mode formation is, in contrast, preferably designed to retain the spatial information existing due to different spatial arrangements of the local antennas with regard to the detection volume. The secondary mode has a sensitivity distribution that is different itself from the first sensitivity distribution in the phase coding direction of the MR response signals. For example, the signal-to-noise ratio of the secondary mode is increased in a region outside of the first target region. The phase coding direction coincides, for example given the use of the primary and secondary modes for PAT, with the direction in which the local antennas are successively arranged.

One advantage of the method for mode formation is that, from the MR response signal of the local antennas, a primary mode is formed that has an increased sensitivity in the first target region. As a second example, a second mode is obtained that has supplementary information and that can be used in combination with the primary mode, for example for PAT.

A further advantage of the method for mode formation is that, in the processing of the modes into an MR exposure, the sensitivity-optimized MR exposure can be received with only one input channel, but if further input channels are available, further modes, for example the secondary mode, also can be included in the imaging. This enables, for example, the implementation of PAT with primary and secondary modes. The advantage thus is achieved that, given the use of at least two local antennas, the information content of all MR response signals can be newly distributed to the primary and secondary modes. For example, modes can result that represent spatially coded field functions in a hierarchical organization. The redistribution can be implemented, for example, with regard to the sensitivity distribution of an individual mode or with regard to the use of both modes for PAT. In the advantageous case of the redistribution of a number of MR signals, the entire information content can be transferred to an equal number of modes.

The second of the above-cited objects is achieved in a method to provide modes for MR imaging, wherein at least two local antennas that simultaneously receive an MR response signal are used. An MR response signal is obtained that consists of signal portions that are spatially associated with different regions of a detector volume of the local antennas. At least two modes are formed from the response signals using the method specified above for mode formation; and at least one mode is supplied to a reception channel of an MR imaging unit.

The method for providing modes inherently has advantages of the method for mode formation, as well as the advantage of allowing a sub-group of the formed modes to be supplied to the MR imaging unit. For example the number of the modes in the sub-group and the information content contained therein can be adapted to the properties of the MR imaging unit, for example to the number of the available reception channels.

The third of the above-cited objects is achieved by a reception unit for an MR device with at least two local antennas that are separately connected to a combination network for combining the respective antenna signals, and the combination network generates at least two different modes that are the linear combinations of the antenna signals, and at least two of these different modes are present at an output of the combination network.

An advantage of this reception unit is that it generates modes from the MR response signal of the local antennas that, due to their information content, are suitable for various imaging methods.

A further advantage in the use of the reception unit is that an MR image processor can be used that has a number of reception channels adjusted to the particular imaging, that is no longer dependent on the number of local antennas used in the reception unit, but is instead dependent on the information content required for the particular MR imaging being used, which can be assembled from the modes according to factors relevant for the imaging. This enables a cost-effective assembly of an MR device in which a number of reception channels optimized for the actual capability of the MR device are used in the MR imaging unit.

A further advantage of the reception unit is that the same reception unit can be used with MR imaging units with different numbers of reception channels, or an MR device the number of reception channels can be subsequently expanded in order to use more modes with additional information content, thus increasing the capability of the MR imaging.

In an embodiment of the method for mode formation, the linear combination for generation of the primary mode includes a linear coefficient that in particular depends on the geometric position of the local antenna with regard to the first target region. This has the advantage that the first target region can be determined by the selection of the linear combination, with the sensitivity distribution of the primary mode being optimized.

In another embodiment of the method for mode formation, the linear combination includes a weighting and/or phasing factor that accounts for the influence of the different distances and/or angles of a target region from the various local antennas. This enables the antenna signals to combine with one another such that, for example, in the primary mode a maximum signal is obtained from the target region. An example of this is the formation of a circularly polarized signal from combination of a number of antenna signals. For example, a signal of an antenna that is larger than average due to a shorter distance of the antenna from the target region is scaled in the linear combination by a corresponding weighting factor to a desired level. For example, a signal with a high signal-to-noise ratio can thus be more strongly weighted, meaning it is scaled "high". Additionally, it is possible to consider the different sensitivities of the local antennas with regard to the phase position of the MR emission from the target region, for example by compensating the phase differences by means of a phase factor.

In a further embodiment of the method for mode formation, at least one coefficient is selected in the linear combination for generation of the primary mode, such that an MR exposure generated from the primary mode has a signal-to-noise ratio that is optimized for the first target region. This is particularly effective when a large number of signals enter into the linear combination.

In a further embodiment of the method for mode formation, at least one coefficient of the linear combination for generation of the secondary mode is selected such that an imaging implemented in parallel with the primary mode and the secondary mode optimizes with an acceleration factor of two, the signal-to-noise ratio in a second target region. Such a linearly combined secondary mode has the advantage that in PAT it optimally supplements the primary mode by an acceleration factor of two. The optimization in the signal-to-noise ratio is thereby aligned to a second target region within the PAT measurement. After the deconvolution of the PAT measurement, the second target region corresponds to two points in the MR exposure that are symmetrical in the convolution.

A further advantage of this embodiment is that a parallel imaging with an, acceleration factor of two can be implemented with only two reception channels, when more than two local antennas are used.

In another embodiment of the method for mode formation, in addition to the primary and secondary modes, a tertiary mode is obtained from at least three MR response signals by a weighted linear combination of the MR response signals. This tertiary mode corresponds to an MR signal of an amplitude- and phase-controlled group antenna and exhibits a third sensitivity distribution that is different from the first and second sensitivity distributions in the phase coding direction of the MR response signals. For example, if three MR response signals that originate from three local antennas can be combined by means of weighted linear combination, the information remaining after the formation of the secondary mode, for example by spatial differentiation with regard to a triple convolution, is thus accepted into the tertiary mode. Given three antenna signals, three modes can advantageously be generated that together have the same information content as the three antenna signals of the local antennas.

In an embodiment of the method for mode formation, at least one coefficient of the linear combination for generation of the tertiary mode is selected such that an imaging implemented in parallel with the primary, secondary, and tertiary modes optimizes, by an acceleration factor of three, the signal-to-noise ratio in a third target region. Such a linearly combined tertiary mode has the advantage that it optimally supplements the primary and secondary modes in PAT by an acceleration factor of three. The optimization in the signal-to-noise ratio is thereby aligned to a third target region within the PAT measurement. After the deconvolution of the PAT measurement, the third target region corresponds to three symmetrical points in the convolutions. A further advantage is that a parallel imaging can also be implemented with an acceleration factor of three with only three reception channels, when more than three local antennas are used.

In a particularly flexible embodiment of the method for mode formation, a preliminary secondary mode and a preliminary tertiary mode are generated, that are orthogonal to one another and respectively orthogonal to the primary mode. Subsequently a secondary mode is generated by a linear combination of both these preliminary modes, such that an imaging implemented in parallel with the primary mode and the secondary mode optimizes, by an acceleration factor of two, the signal-to-noise ratio in a second target region. Orthogonality here refers to a signal space that is occupied by the individual antenna signals and in which the modes form a new base system. The formation of preliminary modes has the advantage that it is simple, starting from the primary mode, to determine orthogonal secondary and tertiary modes. A preliminary secondary mode formed purely according to orthogonal points of view need not in every case be implemented in parallel with the primary mode optimized by an acceleration factor of two with regard to its signal-to-noise ratio. The parallel imaging with the primary mode and the modified secondary mode can be optimized by a linear combination of the preliminary secondary and tertiary modes. This is a simple method for generation of the optimal secondary mode for a parallel imaging with the acceleration factor of two.

In another embodiment of the method for mode formation, one further mode is formed successively by a linear combination of the MR response signals from at least four MR response signals, up to a number whose maximal value is determined by the number of local antennas. The mode exhibits a sensitivity distribution that is different from the sensitivity distributions of all previously formed modes. In this manner, one or more new modes can be incrementally formed by linear combinations of the MR response signals, each new mode having an information content that was not present in the combination of the previously formed modes. The maximal number of the non-redundant modes that can be formed with a new information content is determined by the number of the local antennas.

In a further embodiment of the method for mode formation, from at least four MR response signals up to a number whose maximal value is determined by the number of local antennas, successive new modes are formed by a linear combination of the MR response signals that, with an imaging implemented in parallel with all previous modes, optimizes, by an acceleration factor that corresponds to the number of the modes used, the signal-to-noise ratio in a selectable target region. This has the advantage that the information that can be received using all the local antennas is distributed among the various modes such that a parallel imaging, with an acceleration factor corresponding to the number of previously formed modes, provides optimal results.

In another embodiment of the method for mode formation, two modes are orthogonal to one another. This has the advantage that no redundant information is formed in the case that exactly as many modes are formed as MR response signals are available.

In a further embodiment of the method for mode formation, the first target region is a region in the detection volume that is of particular interest in an MR examination. This has the advantage that, alone with the primary mode, an MR exposure can be generated that, for example, exhibits a maximal signal-to-noise ratio in the region that is of particular interest.

In another embodiment of the method for mode formation, the first target region is a region in the detection volume that, due to the arrangement of the local antennas, exhibits a lower sensitivity in at least one of the local antenna sensitivity distributions. This has the advantage that the sensitivity in the target region can be improved with the aid of the mode used.

In another embodiment of the method for mode formation, at least one coefficient of one of the linear combinations can be adjusted, in particular for selection of the respective target region to be selection. This has the advantage that, for example, the linear combinations for mode formation can be implemented differently depending on the target region, such that the MR exposure can respectively by optimized for different target regions.

In a further embodiment of the method for mode provision, the primary mode is processed into a first MR exposure in an imaging unit. This has the advantage that an MR exposure is obtained that exhibits a very good signal-to-noise ratio in the first target region, as well as an FOV that extends over the detection volume of the linearly combined local antennas.

In a further embodiment of the method for mode provisioning, the secondary mode is associated with a second reception channel of the MR imaging unit, and the primary and secondary modes are processed into a second MR exposure in the imaging unit by means of parallel imaging technology. This has the advantage that, for example, a parallel imaging is possible with an acceleration factor of two, even when only two reception channels are present in the MR imaging unit and the secondary mode was formed from more than two antenna signals. A further advantage is that all antenna signals do not have to first be read out in order generate a corresponding acceleration of the image treatment process, but rather two reception channels are sufficient to read out the primary and secondary modes.

In another embodiment of the method for mode provisioning, at least three local antennas are provided, and a tertiary mode is formed using the above-cited method for mode formation, this tertiary mode being associated with a third reception channel of the MR imaging unit, and the primary, secondary, and tertiary modes are processed to form a third MR exposure in the imaging unit by means of parallel imaging technology. Similar to the imaging with an acceleration factor of two, this has the advantage that a parallel imaging by means of the primary, secondary and tertiary modes is possible with an acceleration factor of three, even when only three reception channels are present in the MR imaging unit and more than three antenna signals were combined for the tertiary mode.

In a further embodiment of the method for mode provisioning, at least four local antennas ($L_k$, $M_k$, $R_k$) are provided, at least one further mode is formed using the method for mode formation, this further mode being associated with at least one further reception channel of the MR imaging unit, and at least two and at most all, modes are processed into a further MR exposure in the imaging unit, in particular by means of parallel imaging technology. An advantage in this embodiment is that scaling of the reception channels of the MR imaging unit is possible, meaning that, as soon as the antenna signals were linearly combined into a set of modes, the possibility exists to incorporate a subset of the modes into the MR imaging, depending on requirements. Parallel imaging with signals from many antennas thus can already be implemented with a low number of reception channels.

The various embodiments of method for mode formation thus enable an MR device to very flexibly adapt to the requirements of a user. For example, with regard to the cost of the MR device, which is dependent on the number of the reception channels, a maximum cost can thus be set from the use of a number of local antennas. This is possible by the modes for imaging that optimize the acceleration or the signal-to-noise ratio being used that correspond to the number of the present reception channels. Additional reception channels can subsequently be added and the capacity of the MR device improved, by allowing further modes in the imaging.

In another embodiment of the reception unit, the modes exhibit sensitivity distributions in the phase coding direction. This has the advantage that the various modes can be used with one another for parallel imaging.

In a further embodiment of the reception unit, the linear combination has a linear coefficient in the form of a phase shifter and/or a weighting factor. This has the advantage that the antenna signals can be weighted and combined with one another.

In another embodiment of the reception unit, one of the modes corresponds to a signal of an antenna the geometry which is fashioned for receiving a spatial field structure that can not be directly received with a single one of the local antennas. This has the advantage that targeted field structures that require a more complex antenna structure can be received by an appropriate combination of the antenna signals.

In another embodiment of the reception unit, the combination network has an additional phase shifter to compensate signal run-time differences. This has the advantage that signal run-time differences can be compensated that, for example, ensue with one another given multiple combinations of two signals.

In a further embodiment of the reception unit, the combination network has a signal combination unit with two inputs and two outputs, in which the signals at the respective inputs, with regard to a linear coefficient, are added without a phase difference and also are added with a phase difference (in particular of 60°, 90°, 120° or 180°) in order to generate to signals at the respective outputs. Such a signal combination unit enables advantageous combinations of two signals. The signals thereby obtained can directly form a mode, or can be combined with further signals with identical or similar signal combination units. The embodiment can be advantageously realized as a passive network. An example for a passive four-port network is a 90° hybrid.

In a further embodiment of the reception unit, at least three local antennas are present and the combination network has two signal combination units with two inputs and two outputs, wherein the first two antenna signals are connected with the inputs of the first signal combination unit, the first output of the first signal combination unit is connected with a first mode output and the second output is connected with the first input of the second signal combination unit. A third antenna signal is connected with the second input of the second signal combination unit, and the first output of the second signal combination unit is connected with a second mode output.

In another embodiment of the reception unit, the second output of the second signal combination unit is connected with a third mode output.

In another embodiment of the reception unit, the first signal combination unit adds the signals of two laterally arranged local antennas with a weighting factor of $2^{-1/2}$. The result is a secondary mode. This first signal combination unit furthermore adds the signals with a phase difference 180°, and the second signal combination unit adds the thus-obtained signal with the antenna signal of a third local antenna arranged between the lateral local antennas with a weighting factor of $2^{-1/2}$. This addition takes place with a phase shift of 90° in order to generate a tertiary mode, and with a phase difference of −90° in order to generate a primary mode. This embodiment has the advantage that measurements with the three antennas can be implemented, with either one, two, or three reception channels of the MR imaging unit being used for imaging.

The weighting factors and phase differences are selected such that the primary mode in the central region of the detection volume of the three antennas, arranged substantially parallel and adjacent to one another, corresponds to a type of CP mode, and such that the secondary mode carries information about the left/right asymmetry, and that the tertiary mode in the central region of the detector volume corresponds to a type of anti-CP mode. First this means a primary mode is generated that corresponds to a radio-frequency signal that is generated in the central region of the detection volume by a circular polarization with the rotational direction of the magnetic resonance signal generating the MR response signal (CP mode). Second, a secondary mode is generated that corresponds to a radio-frequency signal that contains information about the lateral differences in the detection volume of both antennas, and third a tertiary mode is generated that corresponds to a radio-frequency signal that is generated in the central region of the detection volume by an "anti"-circular polarization (anti-CP mode), i.e. by a circular polarization with a rotational direction reversed in comparison to the CP mode.

In another embodiment of the reception unit, a first signal combination unit adds the signals of two laterally arranged local antennas with a weighting factor $2^{-1/2}$. The addition takes place with a phase difference of 60°, resulting in a secondary mode, with a phase difference of 120°. The second signal combination unit adds the thus-ensuing signal with the antenna signal of a third local antenna arranged between the lateral local antennas with a weighting factor of $2^{-1/2}$. The addition takes place with a phase difference of 60° to generate a primary mode, and with a phase difference of 120°, to generate a tertiary mode.

This embodiment has the advantage that it can be used together with a head antenna that is formed by three local antennas arranged with an angle of 60° to one another. Similar to the preceding embodiment, a type of CP mode, a left/right differentiating mode, and a type of anti-CP, mode are generated from antenna signals of such an antenna. This realization form has the further advantage that it can be realized with simple signal combination units, for example two 90° hybrids. The middle antenna is overemphasized, such that a small deviation ensues from the CP mode. In comparison to the advantage of the simplicity of the assembly, the error can be tolerated.

In another embodiment of the reception unit, the combination network and/or a signal combination unit is substantially reflection-free and/or loss-free. Substantially no information loss ensues with regard to the incoming antenna signals in the signal combination unit. This has the advantage that the contribution is small for signal noise due to losses.

In a further embodiment of the reception unit, a mode output can be connected with a reception channel of a local antenna selection unit. This has the advantage that the selection of antenna signals between different modes for imaging can be selected instead.

DESCRIPTION OF THE DRAWINGS

FIG. 4 is an arrangement of three local antennas of a body reception antenna with the corresponding spatial field structures in accordance with the invention.

FIG. 5A–5C show distributions of the signal-to-noise ratio of the left, middle and right antennas from FIG. 4.

FIG. 6A–6C show signal-to-noise ratio distributions of the primary, secondary and tertiary mode that are formed from the antenna signals of the FIGS. 5A–5C.

FIG. 10 is a schematic diagram of a linear combination network of a body reception antenna in accordance with the invention.

FIG. 11 is a mathematical notation of the mode formation pertaining to FIG. 10, using a mode matrix in accordance with the invention.

FIG. 12 is a schematic of a 90° hybrid for use in the inventive method.

FIG. 19 schematically illustrates the cooperation of a number of receiving units with a channel multiplexer and an imaging unit in accordance with the invention.

FIG. 20 explains the target point selection in the primary mode formation in the parallel imaging in accordance with the invention.

FIG. 21 explains the target point selection in the secondary mode formation in the case of parallel imaging in accordance with the invention.

DESCRIPTION OF THE PREFERRED EMBODIMENTS

Figure 1:
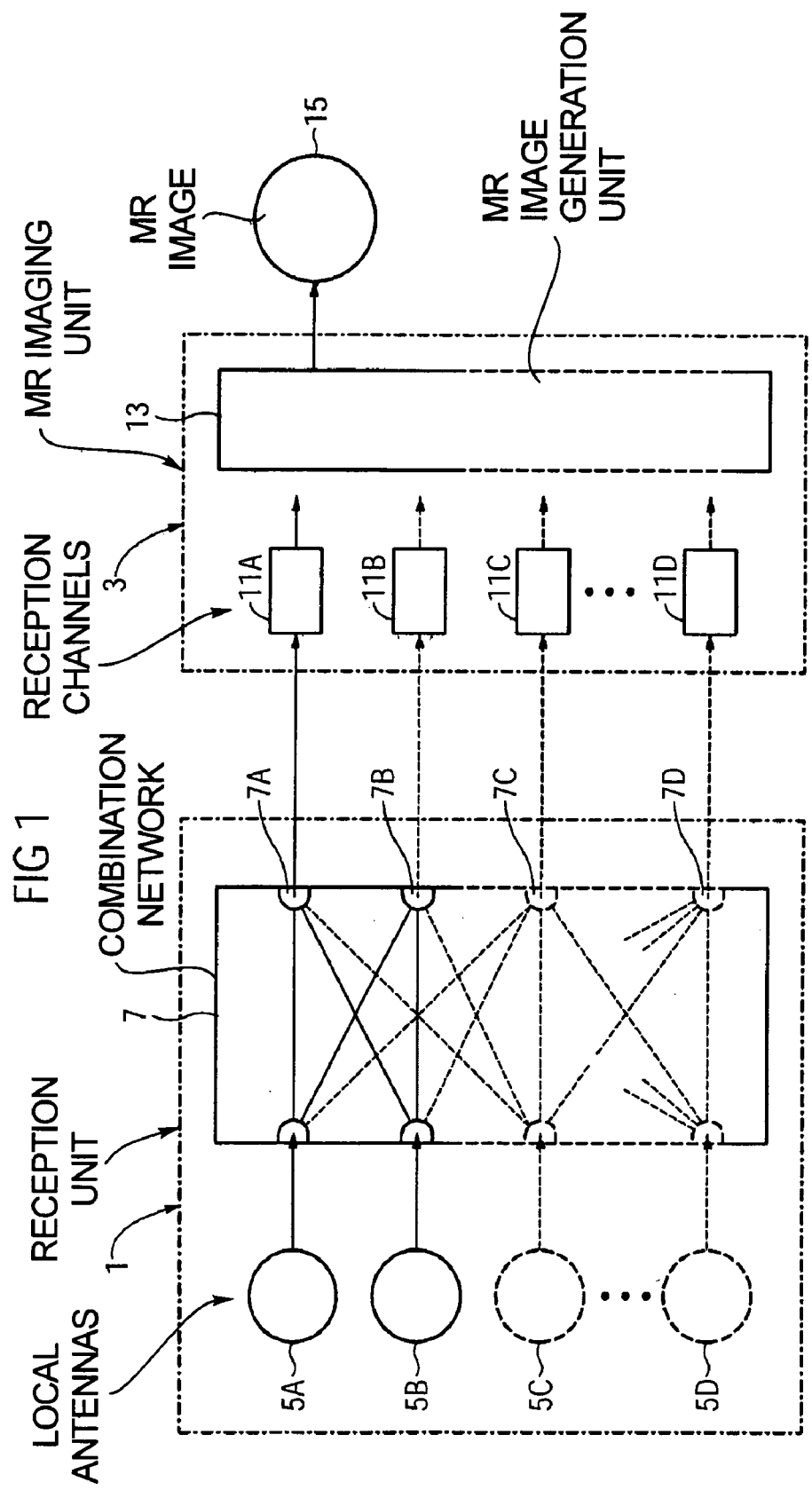
FIG. 1 is a schematic overview of the assembly of a reception unit and its cooperation with an MR imaging unit.

FIG. 1 schematically shows the assembly of a reception unit 1 and its cooperation with an MR imaging unit 3. The reception unit 1 has an arrangement of local antennas 5A, . . . 5D that are, for example, linearly polarized. These are connected with a combination network 7 that has at least two mode outputs 7A, . . . 7D. In the combination network 7, the antenna signals of the local antennas 5A, . . . 5D are combined into different modes. These are present at the mode outputs 7A, . . . 7D of the combination network 7 as mode signals. A primary mode is present at the mode output 7A, a secondary mode at the module output 7B, a tertiary mode at the mode output 7C, and so on. The mode output 7A is connected with a reception channel 11A of the MR imaging unit 3.

For imaging, the analog signal of the primary mode is digitized and processed by an image generation unit 13 into an MR image 15. If additional further mode outputs 7B, . . . 7D are connected with corresponding reception channels 11B, . . . 11D, these can also be included for imaging by the image generation unit 13, in order, for example, to implement a parallel imaging. If, for example, the primary mode and the secondary mode are used, a parallel imaging can be implemented with an acceleration factor of two.

Such a cooperation of the reception unit 1 with the MR imaging unit 3 has the advantage that a number of modes that are made available by the MR imaging unit 3 is generated independent of the number of antennas 5A, . . . 5D used, depending on the combination network 7. Depending on the configuration of the MR intraoperative 3 with reception channels 11A, . . . 11D, the MR imaging unit 3 can apply various types of imaging techniques. For this, the reception unit 1 is correspondingly suitable to provide variously configured MR imaging units 3 with signals adapted to the respective requirements. The capability of the reception unit 1 can thus be optimally used, scaling with the number of the reception channels 11A, . . . 11D.

If, for example, only the primary mode is used by the MR imaging unit 3, an MR exposure 15 can be generated that images the entire acquisition region FOV given by all local antennas 5A, . . . 5D, and simultaneously the signal-to-noise ratio of the MR exposure 15 can be optimized to a first target region via a suitable linear combination of the antenna signals.

Figure 2:
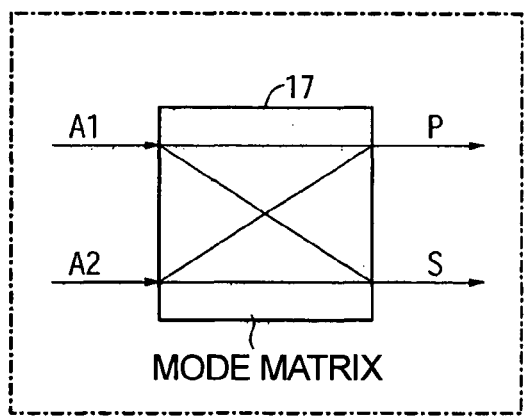
FIG. 2 schematically illustrates the method for forming of at least two modes in accordance with the invention.

In FIG. 2, the operation of a combination network is schematically shown for the case of two antenna signals A1, A2 being input and two modes, a primary mode P and a secondary mode S, being formed.

In the following, the terms combination network and mode matrix are used synonymously. The term mode matrix means the function of the combination network that exists therein to generate a linear combination of the input signals. A linear combination via a matrix can be specified mathematically, the result of a linear combination is correspondingly designated a "mode".

It is seen in FIG. 2 that a mode matrix 17 combines the input antenna signals A1 and A2 with one another in order to generate the primary mode P and the secondary mode S. The operation of the mode matrix 17 can be described by a matrix MM that reduces the input antenna signals, written as a vector, into the modes, likewise written as a vector:

$$\begin{pmatrix} P \\ S \end{pmatrix} = MM \begin{pmatrix} A1 \\ A2 \end{pmatrix}$$

A combination network is preferably an approximately lossless network adapted reflection-free at all gates for MR antenna signals. The matrix MM that represents the combination network must be invertible. It follows from the lossless property that the weighting vectors forming the matrix MM are additionally orthogonal to one another, but this is not mandatory. Orthogonality is explained in more detail in connection with FIG. 7. The lossless property additionally has the advantage that no information loss ensues due to thermal background noise in the network. This is in particular an advantage since noise due to loss can degrade the signal-to-noise ratio of the MR exposure. An advantageous passive network is one having the property that the matrix is reciprocal. This is of importance in the synthesis of the network.

Figure 3:
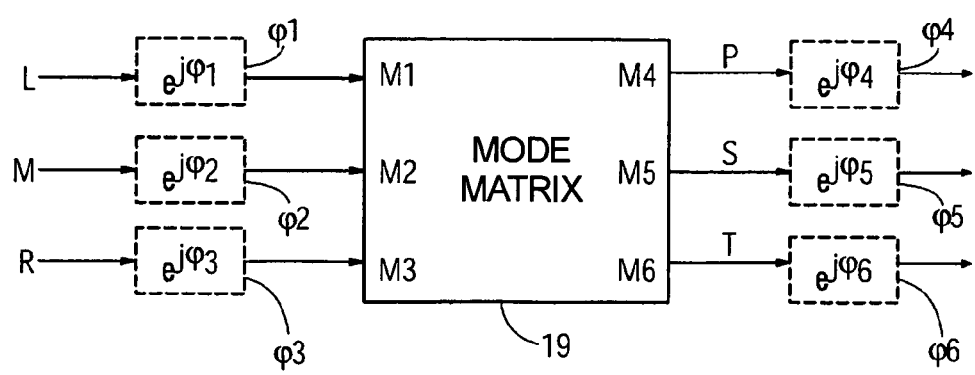
FIG. 3 a schematically illustrates the method for forming three modes from three MR response signal in accordance with the invention.

In FIG. 3, an image of three modes P, S, T from three MR response signals L, M, R of MR receiving antennas is shown. This situation forms the basis of most of the examples specified in the following. Three input antenna signals L, M, R, that are respectively received by left, middle, and right antennas, are supplied to inputs M1, M2, M3 of a mode matrix 19. In the mode matrix 19, they are combined into three modes, i.e. a primary mode P, a secondary mode S and a tertiary mode T. These modes are present at three outputs M4, M5, M6. Additionally, the phases of both the input signals L, M, R and the modes P, S, T can be modified by phase shifters φ1–φ6.

FIG. 4 shows an exemplary embodiment for the arrangement of three antennas $L_k$, $M_k$, $R_k$ as they could be present in the case of an MR body reception antenna. The antenna arrangement has an acquisition range $FOV_k$ that is given by the overlapping acquisition regions of the individual antennas $L_k$, $M_k$, $R_k$. The region to be examined of the body of a patient is advantageously located in the acquisition region $FOV_k$.

Additionally, the field curves FL, FM, FR representing the antenna sensitivity distributions of the three antennas $L_k$, $M_k$, $R_k$ are schematically shown in FIG. 4. The three field vectors SR, SL, SM specifying the sensitivity of the antennas $L_k$, $M_k$, $R_k$ are drawn for a central point $Z_k$ that is located in the center of the acquisition region $FOV_k$ and on a symmetry axis $A_s$ of the antenna arrangement. The directions of the three field vectors SR, SL, SM exhibit an angle of 90° or 180° to one another, and the field vector SM is stronger by a factor of $2^{1/2}$ due to the smaller distance of the central point $Z_k$ from the antenna $M_k$ in comparison to the field vectors SR, SL.

Using a combination network for linear combination of the antenna signals, modes should now be formed that, for example, exhibit an increased sensitivity at location $Z_k$. Given a circular polarized MR excitation, an antenna arrangement aligned to a circular polarized MR emission signal achieves a maximum reception signal. A stronger reception signal improves the signal-to-noise ratio, for example in comparison to the signal-to-noise ratio that could be achieved with a linear polarized antenna under identical conditions.

The field curves FL, FM, FR of the three antennas L, M, R indicated in FIG. 4 now suggest an operation for formation of a mode that is particularly sensitive to a circular polarized signal. For this, the three antenna signals are combined such that a field curve rotating around the point $Z_k$ ensues that is optimally adapted to the circular polarized emission originating from point $Z_k$. For this, the signals SR and SL are added to one another with a phase difference of 180°, meaning the amounts are added in spite of the different signs of the signals. The arising "sum signal" exhibits a phase shifting of 90° with the signal SM. The signal SM is correspondingly added with a phase difference of 90° to the sum signal of the signals SR and SL. The weightings are selected such that the different signal strengths are considered, and a purely circular polarization sensitivity is generated, i.e. the signal SM is weighted more strongly in comparison to the phase-shifted sum signal of the signals SR and SL.

The phase and weighting factors depend in general on the selection of the target region that is shown in FIG. 4 by the central point $Z_k$.

There are various factors that enter into the selection of the target region $Z_k$. For example, it can be placed at a location that is of special medical interest. In the case of the head coil, this would be by the spinal column of a patient. Another criterion is the noted signal-to-noise ratio. The target region can thus be placed at a point of the acquisition region of the antenna arrangement in which reception ensues with a low signal-to-noise ratio when an overall exposure is implemented with all antennas. If a further MR body reception antenna arrangement is positioned symmetrically on the opposite side of the acquisition region $FOV_k$, the point with the lowest signal-to-noise ratio lies, in the example of FIG. 4, in the center $Z_k$ of the acquisition region $FOV_k$, since the point $Z_k$ is furthest removed from all acquiring antennas.

It would be advantageous for each point in the acquisition region to be able to form an optimal primary mode. This is possible when the linear coefficients can be adjusted in the linear combination, i.e. the phase and weighting factors. It is also advantageous to favor linear combinations which form the basis of a simple technical assembly. The advantage of a simple technical assembly can justify the use of non-optimal phase relations and weighting factors, as long as the difference of the signal-to-noise ratio thereby achieved and the optimal achievable signal-to-noise ratio remains negligibly small. Generally, it is advantageous to generate the primary mode substantially as a type of a circular polarized mode. Embodiments for this are specified in connection with FIGS. 10 and 16.

The FIGS. 5A, 5B and 5C show simulations of the distributions of the signal-to-noise ratio (SNR distributions) EL, EM, ER of the left, middle and right-antennas $L_k$, $M_k$, $R_k$ from FIG. 4 in the acquisition region $FOV_k$. The sensitivity is represented by the signal-to-noise ratio (SNR) which is plotted two-dimensionally in greyscales. Black means a low SNR, and white means a high SNR. As in FIG. 4, the central point $Z_k$ is indicated in the center of the distributions. The sensitivities are strongest in proximity to the antennas, corresponding to the arrangement of the local antennas to the acquisition region $FOV_k$. In the simulations, the acquisition region is shown in a pixel image with 250×250 pixels. A low signal-to-noise ratio is clearly recognizable in the central point $Z_k$.

FIGS. 6A, 6B and 6C show simulations of the SNR distributions EP, ES, ET that arise for the primary mode P, the secondary mode S and the tertiary mode T of a body reception unit. As described above, the primary mode P is formed as a circularly polarized mode (CP mode). The manner by which the three modes P, S, T are individually formed is specified in detail in the following. An increased region with a good signal-to-noise ratio on the side of the acquisition region $FOV_k$ facing the antennas is clearly recognizable at the central point $Z_k$. The primary mode P covers the entire half of the acquisition region $FOV_k$ that lies on the side of the three local antennas $L_k$, $M_k$, $R_k$.

The secondary mode S and the tertiary mode T exhibit sensitivity distributions EP, ET that are differentiated from the other modes P, S, T. The differences are particularly developed in the phase coding direction ρ that in this case lies in the direction in which the three antennas are arranged laterally to one another. After the formation of the primary mode P, it is possible to generate an MR exposure with the SNR distribution EP given in FIG. 6A with only one input channel. The CP-type primary mode P is thereby selected such that it maximizes the signal-to-noise ratio in the central point $Z_k$. To generate such an MR exposure, only one input signal is processed, and correspondingly no parallel imaging ensues.

The secondary mode S is selected in FIG. 6B such that a maximal signal-to-noise ratio is achieved in a second image region to be selected when an MR exposure is generated with an acceleration factor of two. The secondary mode S shows an intensified (amplified) sensitivity in the proximity of the left and right antennas $L_k$, $R_k$. For parallel imaging, the primary mode P and the secondary mode S are thereby used. Although the primary and secondary modes P, S exhibit a right-left symmetry as to the sensitivity magnitude, a right-left differentiation is possible in PAT due to the phases of the modes.

Figure 6E:
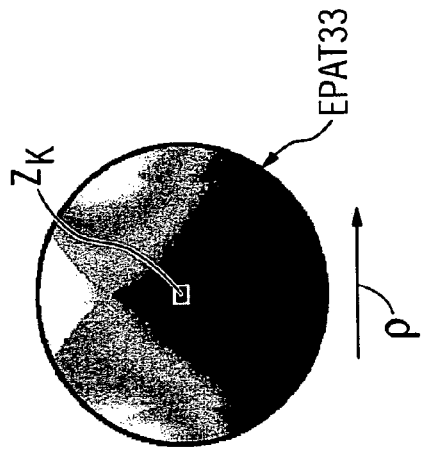
FIG. 6E shows the signal-to-noise ratio distribution of a PAT measurement with the primary, secondary, and tertiary modes, given an acceleration factor of three in accordance with the invention.
Figure 6G:
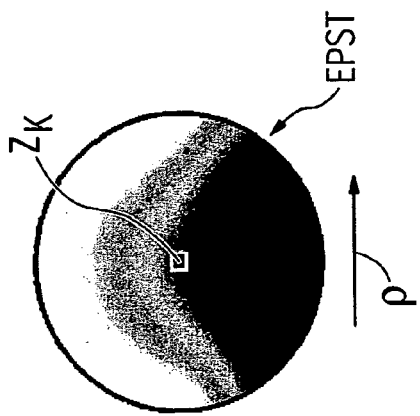
FIG. 6G shows the signal-to-noise ratio distribution of a non-accelerated MR exposure, given the use of all three modes in accordance with the invention.
Figure 6D:
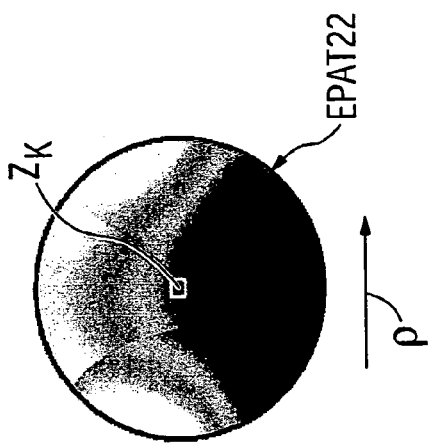
FIG. 6D shows the signal-to-noise ratio distribution of a PAT measurement with the primary and secondary modes, given an acceleration factor of two in accordance with the invention.

FIG. 6D shows a simulated SNR distribution EPAT22 of a PAT measurement with an acceleration factor of two, with the primary mode P and the secondary mode S being used for imaging. An improvement in the signal-to-noise ratio is recognizable in the region of the left and right antennas $L_k$, $R_k$. Furthermore, effects of the PAT convolution are recognizable in the form of structures in the SNR distribution EPAT22. Without mode matrix, all three signals must be used. With mode matrix, a PAT with an acceleration factor of two can already be implemented with two signals.

The tertiary mode in FIG. 6C is correspondingly selected such that a maximal signal-to-noise ratio is achieved in a further image region when a parallel imaging is implemented with all three modes P, S, T and an acceleration factor of three. The tertiary mode exhibits an intensified sensitivity in the proximity of the middle antenna $M_k$, as well as (but not as strongly) an intensified sensitivity in the proximity of the left and right antennas $L_k$, $R_k$.

FIG. 6E shows a simulation result of an SNR distribution EPAT33 given a use of all three modes P, S, T and an acceleration factor of three of a PAT measurement. The effects of the triple convolution on the sensitivity extend in the form of structures over nearly the entire acquisition region. The result of the PAT imaging with the three modes P, S, T does not differentiate from a PAT imaging with the three antenna signals L, M, R, that for this reason are not shown separately.

Figure 6F:
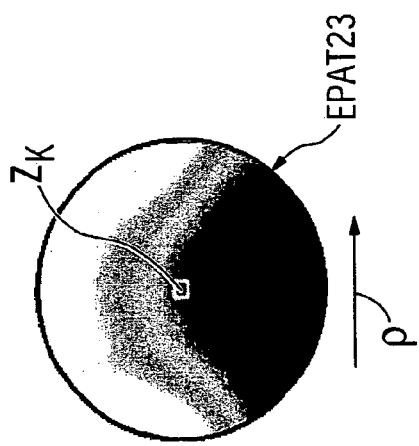
FIG. 6F shows the signal-to-noise ratio distribution of a PAT measurement with the primary, secondary, and tertiary modes, given an acceleration factor of two in accordance with the invention.

In FIG. 6F, an SNR distribution EPAT23 is simulated for the case that all three modes P, S, T are used given an acceleration factor of two in the PAT imaging. Abstaining from slight influences due to the PAT imaging, the signal-to-noise ratio is already very close to the ideal sensitivity curve that is achieved in the use of all three modes (or all three antenna signals) without image acceleration. The simulation of the SNR distribution appertaining thereto is shown in FIG. 6G in which primary, secondary and tertiary modes are used without acceleration to generate an MR exposure.

FIGS. 6A–6G explain the influence and the application possibilities in the use of modes P, S, T for MR imaging. The respective SNR that corresponds to a type of "magnitude" of sensitivity was shown for clarity. However, the phases (which are not shown here) are also of substantial importance for PAT. The advantage of the use of the modes P, S, T instead of the signals L, M, R is that the PAT measurements with the SNR distributions EPAT11, EPAT12 and EPAT22 suffice with less than three reception channels.

Figure 7:
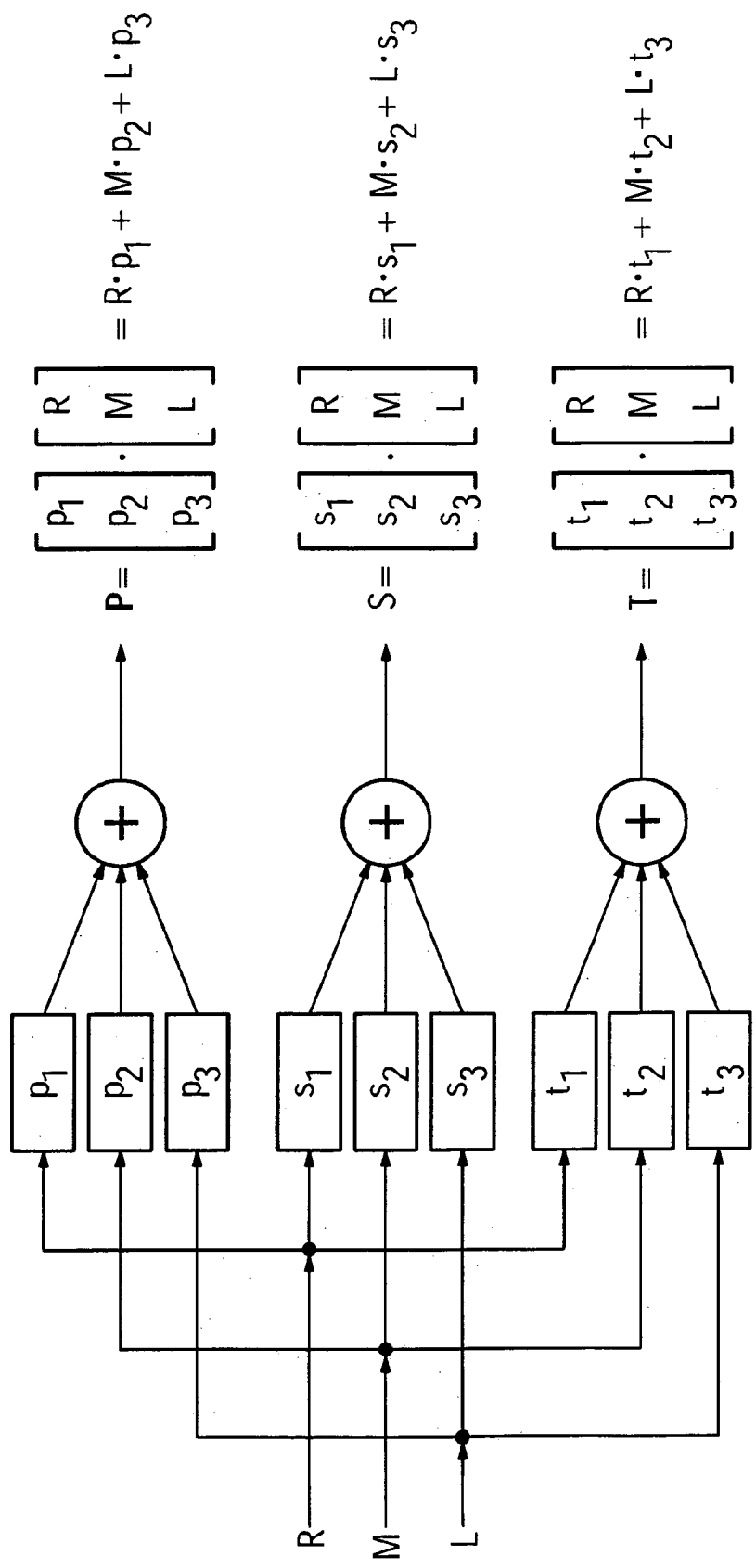
FIG. 7 is schematic diagram of a mode matrix with which three input antenna signals are combined into three modes in accordance with the invention.

FIG. 7 shows a principle schematic diagram of a mode matrix that combined three input antenna signals L, M, R into three modes P, S, T. The mode matrix is shown as groupings of three line vectors, with the primary, secondary and tertiary weighting vectors WP, WS, WT. Mathematically, the primary mode P is formed by the primary weighting vector WP that contains the linear coefficients p1, p2 and p3. The weighting vector of the secondary mode WS contains the three linear coefficients s1, s2 and s3, and the weighting vector WT of the tertiary mode contains the linear coefficients t1, t2 and t3. The linear coefficients can be complex, such that they act both as weighting factors and as phase factors.

Figures 8, 9:
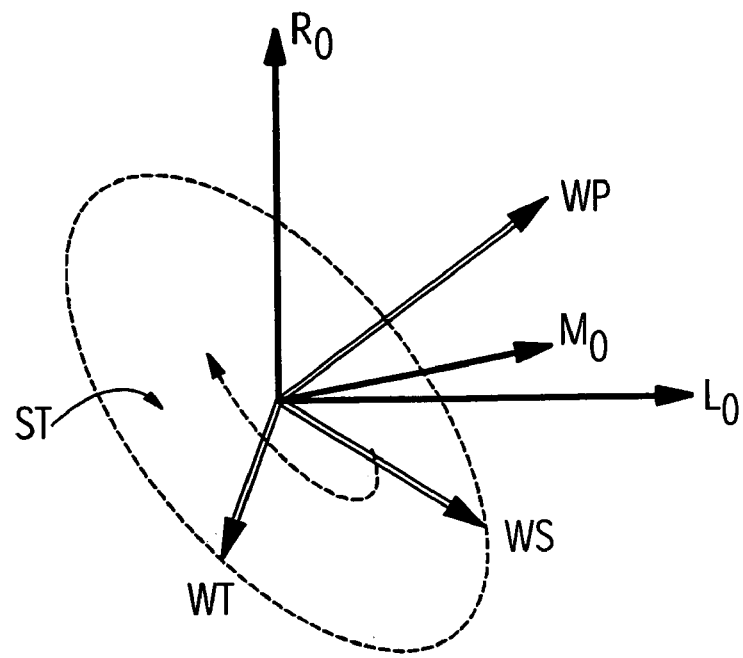
FIG. 8 is a mathematical notation of the generation of the three modes with a mode matrix corresponding to FIG. 7.
FIG. 9 is a geometric depiction of the procedure for the formation of three weighting vectors of a mode matrix in accordance with the invention.

The generation of the modes P, S, T with a mode matrix corresponding to FIG. 7 is summarized in FIG. 8. The antenna signals L, M, R are merged as a signal vector I. The primary, secondary, and tertiary modes P, S, T are correspondingly merged into a mode signal vector. In order to effect an optimal signal-to-noise ratio of the primary mode P in the target region, an optimal primary weighting vector WP can be determined, analogous to the process in U.S. Pat. No. 4,825,162, for example for a selected image point. The primary weighting vector WP is thereby formed from a product from the signal vector I at the selected image point with the noise correlation matrix that results for the three local antennas L, M, R. It is advantageous to additionally normalize (normalization factor n) the weighting vector WP.

Under simplified conditions, the noise correlation matrix can be disregarded, and the weighting vector WP is given by the signal vector $I_0$ at the selected image point with the signals $L_0$, $M_0$ and $R_0$ in the coordinate system spanned by the antenna signals:

$$WP = n \begin{pmatrix} L_0 \\ M_0 \\ R_0 \end{pmatrix}$$

The primary weighting vector WP is formed by a normalized vector sum of the signal vectors $R_0$, $M_0$, $L_0$ of the three antennas L, M, R.

In a passive lossless network, the primary weighting vector WP, the secondary weighting vector WS and the tertiary weighting vector WT are orthogonal to one another, meaning the scalar product of a weighting vector with another weighting vector is zero (* denotes the complex conjugate of a weighting vector):

$$WP \cdot WS^* = 0; \quad WP \cdot WT^* = 0; \quad WS \cdot WT^* = 0$$

Preliminary weighting vectors WS' and WT' are easily generated via the orthogonality. If the linear coefficients are p1, p2, p3, that form know [sic] the primary weighting vector WP, then for example $$WS' = \begin{pmatrix} p_3^* \\ 0 \\ -p_1^* \end{pmatrix}$$

is a possible solution for the secondary weighting vector WS.

Correspondingly, due to its orthogonality, the tertiary weighting vector WT' can be generated with the primary weighting vector WP and the secondary weighting vector WS'. An example is $$WT' = \begin{pmatrix} -p_1^* p_2^* \\ |p_1|^2 + |p_3|^2 \\ -p_3^* p_2^* \end{pmatrix}$$

The secondary mode S'=WS'I generated with WS' fulfills the requirement that its sensitivity distribution differentiates itself from the sensitivity distribution of the primary mode P in the phase coding direction.

However, particularly advantageous is a secondary mode S that, for a selected second image region, achieves a maximal signal-to-noise ratio in a PAT imaging with an acceleration factor of two. An optimization of the signal-to-noise ratio and the imaging of such a secondary mode S can, for example, be achieved in that the secondary weighting vector WS' and the tertiary weighting vector WT' are linearly combined with one another into a new secondary weighting vector WS, for this they are rotated by the angle θ in a plane in which the vectors die:

$$WS = \cos(\Theta)) \cdot WS' + \sin(\Theta) \cdot WT'$$

The coefficients cos(θ) and sin(θ) preserve the normalization, i.e. the normalization does not change.

FIG. 9 geometrically clarifies the superimposition of the three weighting vectors WP, WS, WT. After the primary weighting vector WP is determined, the secondary and the tertiary weighting vectors WS or WT lie in a plane ST perpendicular to the primary weighting vector WP. The alignment of the secondary weighting vector WS is freely selectable. After a preliminary selection of the secondary weighting vector WS', this is combined with the preliminary tertiary weighting vector WT' as long as the emerging secondary mode S results in an optimal signal-to-noise ratio in a parallel imaging together with the primary-mode in the second target region.

Generally, the strategy for generating the weighting vectors WP, WS, WT can be summarized as follows:
1. Establish an image point in a first image region for which an optimal signal-to-noise ratio should be achieved in the primary mode P (without image acceleration).
2. Determine the appertaining linear coefficients that form the weighting vector WP.
3. Normalize the motor vehicle WP with the normalization factor n.
4. Determine a normal plane ST for weighting vector WP.
5. Design two orthogonal weighting vectors WS' and WT' that span the plane ST.
6. Rotate the weighting vectors WS' and WT' in the plane ST by the angle θ to form a weighting vector WS that generated a secondary mode S that, in combination with the primary mode P, achieves an optimized signal-to-noise ratio given an acceleration factor of two for a selected second image region.

This procedure can be expanded to any number of modes. The number of modes that are generated must always be less than or equal to the number of the antenna signals.

The procedure specified in connection with FIG. 4 in the linear combination of the three antenna signals $L_k$, $M_k$, $R_k$ of a body reception antenna suggests the principle schematic diagram of a linear combination network shown in FIG. 10. A combination of the antenna signals is thereby achieved with a 180° hybrid and a 90° hybrid that is realized substantially lossless and reflection-free via the passive hybrids. The inherent loss (eigenloss) of a hybrid is approximately 0.1 dB, and the compensation (equalization) to the required bandwidth can be implemented simply. By an addition of both input signals, a 180° hybrid or a 90° hybrid forms two output signals, in the first case with a phase difference of 0° and 180°, and in the second case with a phase difference of +90° and −90°. Both signals can thereby additionally undergo a further phase shifting that, however, does not change the phase difference in the addition, meaning the relative phase of both signals to one another. This is the case in the 90° hybrid specified in the following.

A further advantage of the realization in FIG. 10 is that the 180° hybrid can be realized via the combination of a 90° hybrid with a connected 90° phase shifter. There are particularly simple technical realizations (European Application 0 337 194) for the 90° hybrid.

In the specified circuit, the antenna signals L, R of both laterally arranged local antennas $L_k$, $R_k$ are respectively connected with an input of a four-port 180° hybrid $H_{180°}$.

The output signal of the 180° hybrid $H_{180°}$, in which both local antenna signals are added, forms the secondary mode S:

$$S = \frac{L + R}{\sqrt{2}}$$

The other output, in which both antenna signals are added with a phase difference of 180°, is connected with the first input of the 90° hybrid $H_{90°}$.

The local antenna signal M of the middle antenna $M_k$ passes through a phase shifter $\phi_k$ that adapts the phase of the middle antenna signal to the phase of the signal connected with the first input if the 90° hybrid $H_{90}°$. After the phase correction, the signal M is supplied to the second input of the 90° hybrid $H_{90°}$.

A tertiary mode T is present at the first output of the 90° hybrid $H_{90}°$ that is formed from the three antenna signals L, M, R as follows $$T = \frac{L-R}{2} + j\frac{M}{\sqrt{2}}$$

A primary mode P is present at the second output of the 90° hybrid $H_{90}°$ that is formed from the three antenna signals L, M, R as follows:

$$P = \frac{L-R}{2} - j\frac{M}{\sqrt{2}}$$

FIG. 11 shows the mathematical notation of the mode formation pertaining to FIG. 10 using the mode matrix, wherein the various complex linear factors are merged, for example ±½, ±1/$\sqrt{2}$, ±j/$\sqrt{2}$, the magnitude of which represent a weighting factor and the complex phase of which represent a phase factor.

An embodiment of a 90° hybrid $H_{90}°$ is schematically shown in FIG. 12. The input signals H1 and H2 are added with a respective phase shift of 38° or −52°, meaning a phase difference of −90°, and form the output signal H3=H1$e^{j38°}$+H2$e^{-j52°}$. Also, they are added with a phase shift of −52° or +38°, meaning a phase difference of +90°, and thus form he output signal H4=H1$e^{-j52°}$+H2$e^{j38°}$. The phase values 38° and −52° arise from the hybrid-intrinsic phase values ±45° plus smaller supply-dependent phases dependent on the concrete embodiment.

If such a hybrid is used in combination with a −90° phase shifter for the input signal H1, a 180° hybrid $H_{180}°$ is achieved in which the signals on the one hand are added without relative phase difference for the output signal H3'=H1$e^{-j52°}$+H2$e^{-j52°}$ and with a relative phase difference of 180° for the output signal H4'=H1$e^{-j142°}$+H2$e^{-j52°}$. The accumulated phase that the output signal H4' acquires in passing through such a 180° hybrid corresponds to −142°.

Figure 13:
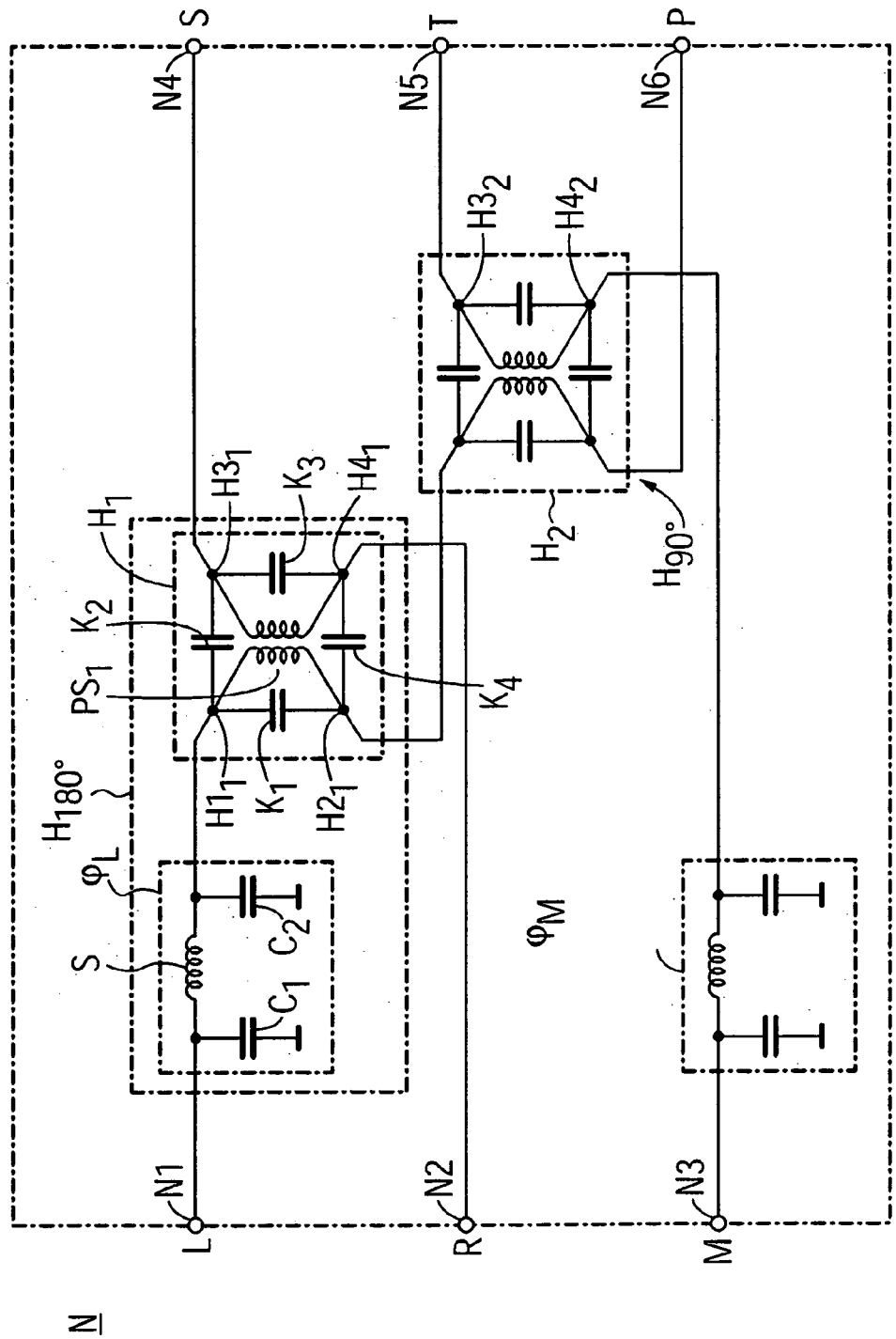
FIG. 13 is an example of a combination network that realizes the mode matrix specified in the FIGS. 10 and 11 in accordance with the invention.

FIG. 13 shows an example of a combination network N that realizes the mode matrix specified in FIGS. 10 and 11.

An advantage of the combination network N is that it is assembled as a passive network with the antenna device of two 90° hybrids $H_1$, $H_2$ and with two phase shifters $\phi L$, $\phi M$. The phase shifter is formed by a coil W and two grounded capacitors C1, C2 arranged on the ends of the coil W. The phase shifter $\phi L$ effects in this example a phase delay of −90° of the antenna signal L, and the phase shifter $\phi M$ effects a phase delay of −142° of the antenna signal M. The two hybrids $H_1$, $H_2$ are each formed by a central coil pair $PS_1$ having inputs $H1_1$, $H2_1$ and outputs $H3_1$, $H4_1$ connected with one another via four connections with capacitors K1, K2, K3, K4. The capacitors K2 and K4 serve only for compensation given not-ideal magnetic coupling of the coil pair $PS_1$.

Three antenna signals L, M, R are present at the inputs N1, N2, N3 of the combination network N. The antenna signals L and M pass through the phase shifter $\phi L$ or $\phi M$. The left antenna signal is subsequently combined with the right antenna signal via the 90° hybrid $H_1$. The signal at the output $H1_1$ of the hybrid $H_1$ forms, the secondary mode S and is present at the output N4 of the combination network N.

The second output $H4_1$ is supplied to the second hybrid $H_2$. The phase-delayed signal M is supplied to the other input of the hybrid $H_2$.

The signal at the output $H4_2$ of the hybrids $H_2$ forms the primary mode P and is present at the output N6 of the network N.

An advantage of the special realization form of the 90° hybrid $H_{90}°$ is that, for example, preamplifiers that amplify the input signals at the input side can be individually supplied with a direct voltage via the 90° hybrids.

This more complex assembly also allows that preamplifiers that amplify the input signals L, M, R on the input side can be individually supplied with a direct voltage via the network N.

Figure 14:
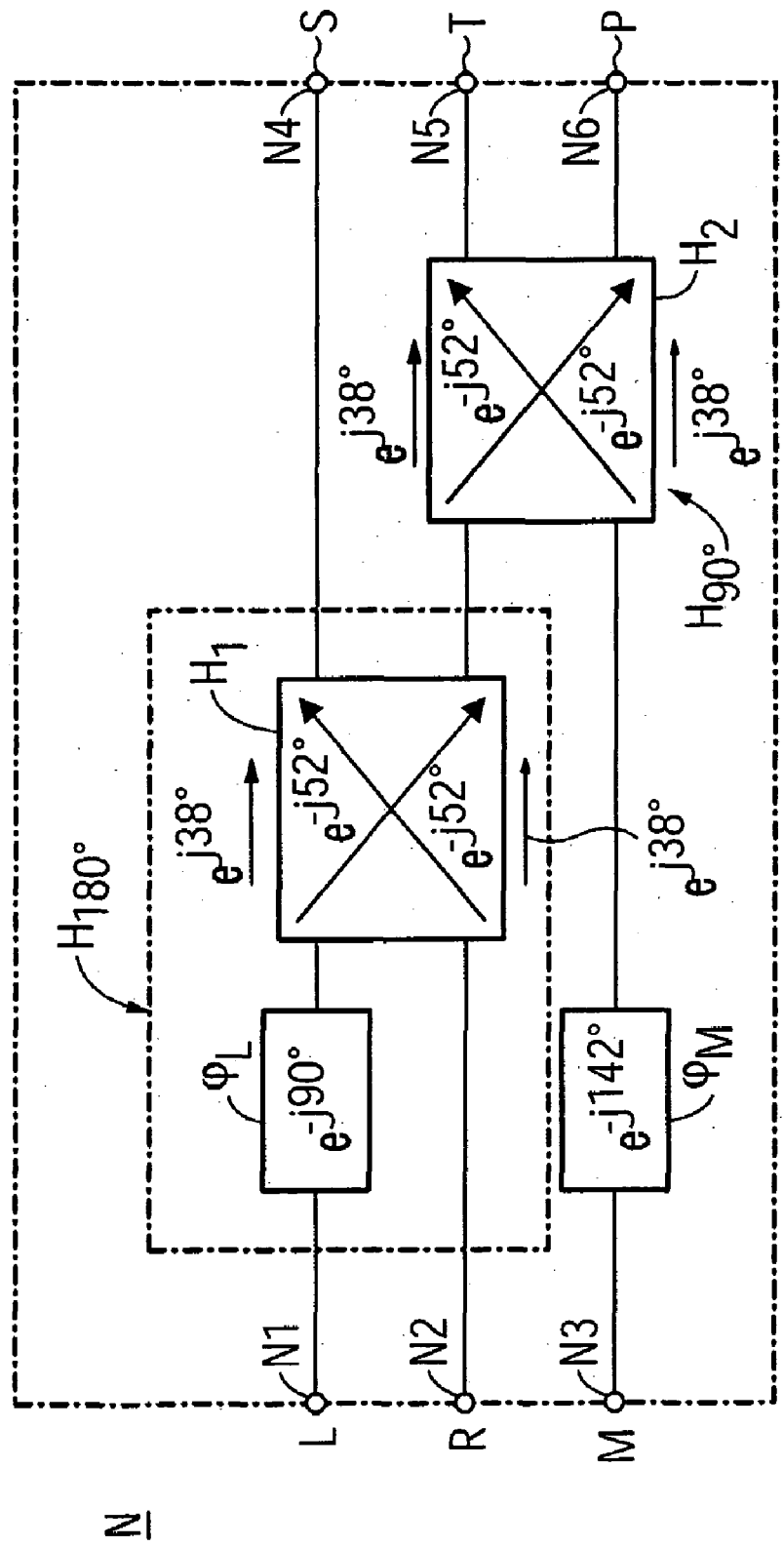
FIG. 14 is a combination of the functions of the individual elements of the network from FIG. 13.

FIG. 14 combines the function of the individual elements of the network N from FIG. 13. The phases $e^{j\phi}$ that the signals undergo in the phase shifters and hybrids, are thereby respectively specified. The signal L is shifted by the phase shifter $\phi L$ by $e^{-j90°}$. The signal M is shifted by the phase shifter $\phi M$ by $e^{-j42°}$. The phases of the 90° hybrids correspond to those in FIG. 12.

Such a combination network can be particularly advantageously used with a body reception antenna in which the antennas $L_k$, $M_k$, $R_k$ are arranged approximately in a plane. The signal is thereby optimized in a target region that is arranged on the axis of symmetry through the middle antenna $M_k$, and whose distance from the middle antenna $M_k$ is less by a factor of approximately $\sqrt{2}$ than the distance from the laterally arranged antennas $L_k$, $R_k$.

Figure 15:
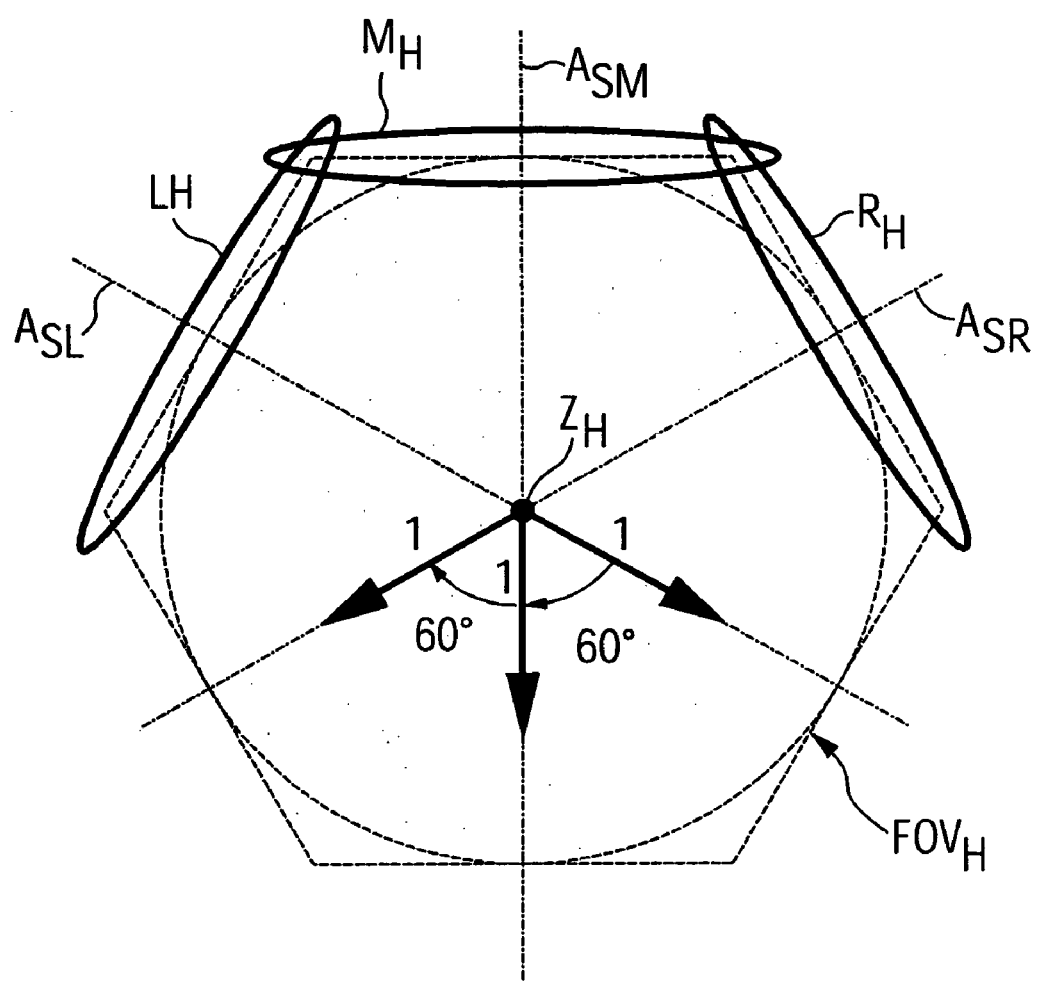
FIG. 15 is an arrangement of three antennas that form a head reception antenna.

FIG. 15 shows the arrangement of three antennas $L_H$, $M_H$, $R_H$ that form a part of a head reception antenna. The antennas do not lie in a plane, as was the case in the preceding example, but rather along the circumference of a cylindrical surface. The signal strength of the three reception signals is equally large in the central point $Z_H$ of the acquisition region $FOV_H$ that lies on all three axes of symmetry $A_{SL}$, $A_{SM}$, $A_{SR}$ through the antennas $L_H$, $M_H$, $R_H$ and the respective directions of the field components that can be received exhibit angles of 60° or 120° to one another.

In the ideal case, in which antennas $L_H$, $M_H$, $R_H$ bordering one another are respectively arranged at an angle of 60° to one another, the weighting and phase factors of the antenna signals L, M, R that lead to the formation of a CP-type primary mode are: (1,−60°), (1,0°), (1,60°).

If, alternatively, the weighting factors are used that result in the use of two 90° hybrids, analogous to the realization of the mode matrix for the body reception antenna, and the phase ratios are respectively adapted to 60°, a mode matrix that can be simply realized results for the head reception antenna with the following weighting and phase factors: (1,−60°), ($\sqrt{2}$,0°), (1,±60°).

In comparison to the optimal linear combination for the head reception antenna, this not-ideal realization exhibits an approximately 1–2% reduced signal-to-noise ratio for the central image region in the primary mode.

Figure 16:
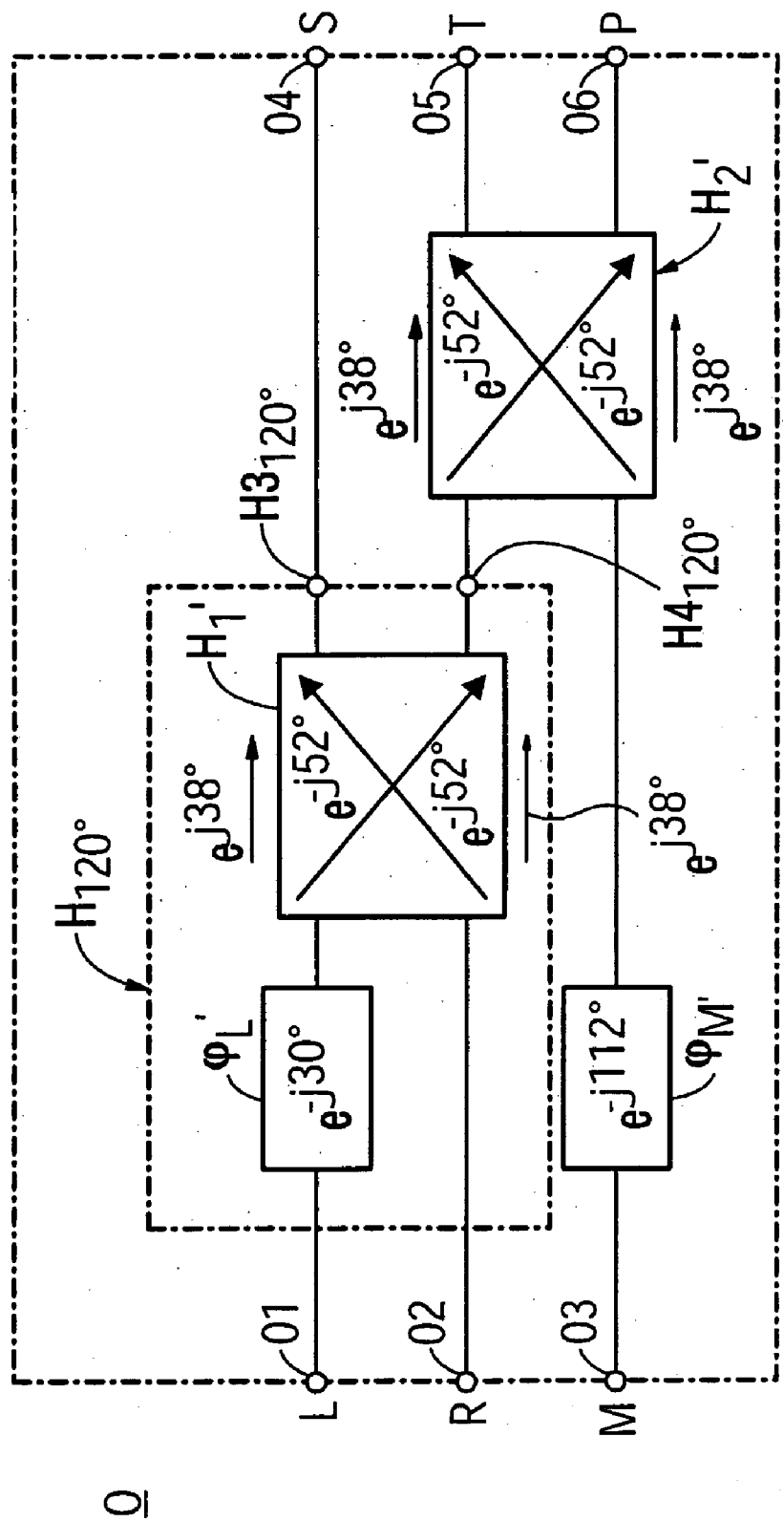
FIG. 16 is an example of a combination network for the head reception antenna from FIG. 15 in accordance with the invention.

The FIG. 16 shows a schematic diagram for a network O that is assembled analogously to the network N in FIG. 14. It has other phase shifters $\phi L'$, $\phi M'$ that effect the phase shiftings by other angles adapted to the situation. The phase shifter φL', that shifts the signal L at the input 01 by a phase of −30°, effects, in combination with the 90° hybrid $H_1$, a relative phase difference of 120° between the antenna signals L and R. The combination thus represents a "120° hybrid". At its first output $H3_{120}°$, that also forms the output 04, the following secondary mode $S_H$ is present:

$$S_H = \frac{1}{\sqrt{2}} L \cdot e^{j8°} + \frac{1}{\sqrt{2}} R \cdot e^{-j52°}$$

The second output $H4_{120}°$ is connected with the first output of a second 90° hybrid $H_2'$. The antenna signal M, that previously underwent a phase shift by −112° in the phase shifter φM', is at the second input of the hybrid $H_2'$. With this, the following tertiary mode $T_H$ results at the output O5

$$T_H = \frac{1}{2} L \cdot e^{-j44°} + \frac{1}{\sqrt{2}} M \cdot e^{-j164°} + \frac{1}{2} R \cdot e^{j66°}$$

as well as the following primary mode $P_H$ at the output O6

$$P_H = \frac{1}{2} L \cdot e^{-j134°} + \frac{1}{\sqrt{2}} M \cdot e^{-j74°} + \frac{1}{2} R \cdot e^{-j14°}$$

The primary mode exhibits the above-specified phase and weighting factors. It can be processed into an MR exposure (that, for example, represents the entire acquisition region $FOV_H$ of the local antennas $L_H$, $M_H$, $R_H$) in a basic version of an MR imaging unit with only one input channel, whereby the signal-to-noise ratio is optimized at the central point $Z_H$ in the MR exposure. The secondary and tertiary modes $S_H$ and $T_H$ are higher modes that are provided by the network M. They can be used in higher-capacity MR imaging units with a number of input channels, for example for parallel imaging. These modes exhibit different sensitivity distribution in the phase coding direction ρ, meaning they contain information that can be used, for example, for location coding in PAT methods.

Figure 17:
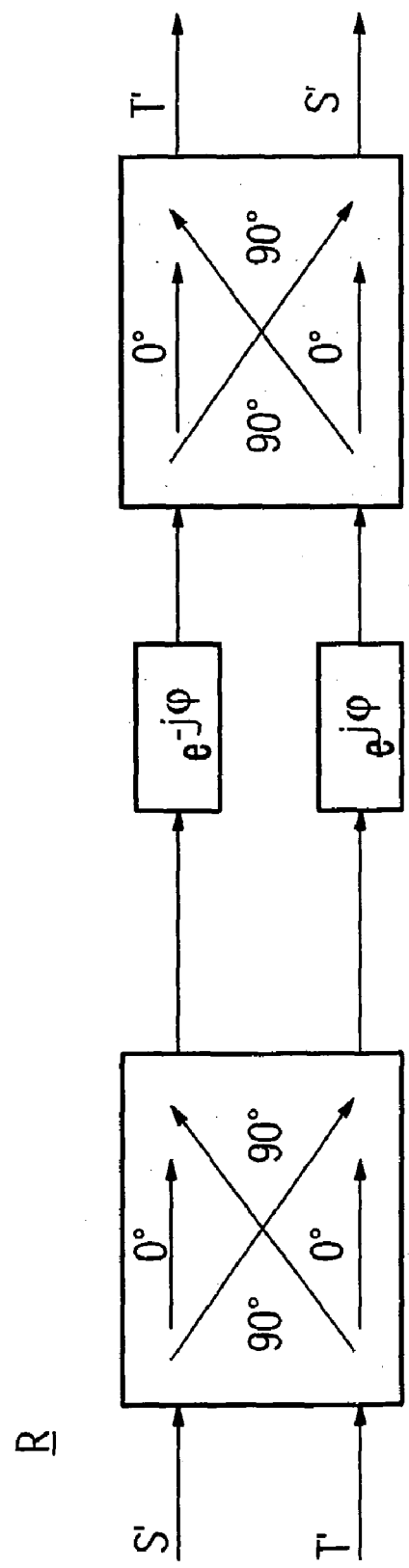
FIG. 17 is a schematic diagram of a network for rotation of the secondary and tertiary vectors in accordance with the invention.

FIG. 17 shows a realization of a network R that effects a rotation of two weighting vectors by an angle φ. Such a network allows the secondary mode to be optimized dependent on its operation in the parallel image processing under inclusion of the primary mode. For this, the secondary and the tertiary modes S', T' are combined with one another with a 90° hybrid. Both output signals respectively pass through a phase shifter that effects a phase shift of ±φ. The thus-phase-shifted signals are combined with one another a second time by means of a second 90° hybrid. The resulting modes S and T are linear combinations of the input modes S' and T':

$S = jS'\cos φ + jT'\sin φ$ and $T = -jS'\sin φ + jT'\cos φ$

If the phase angle φ of the phase shifter can be adjusted, the phase angle φ can be changed, for example in test measurements, as long as the signal-to-noise ratio in a PAT measurement with the acceleration factor of two exhibits an optimal signal-to-noise ratio at the desired target region.

A combination in the form of a cascade circuit of the networks from FIG. 14 and FIG. 17, or from FIG. 16 and FIG. 17, can subsequently be merged into a simplified network.

Figure 18:
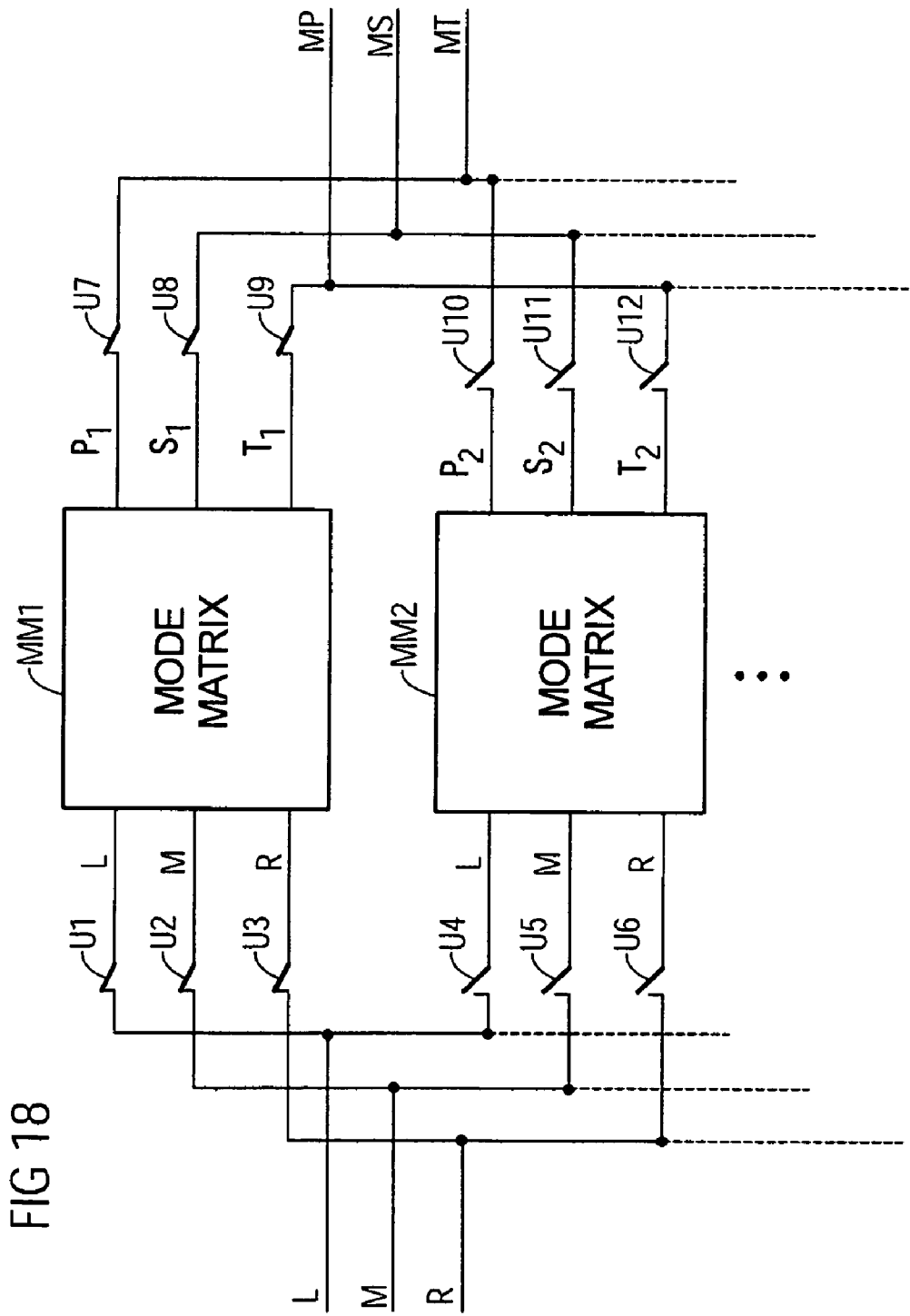
FIG. 18 schematically illustrates an alternative operation of a number of mode matrices in accordance with the invention.

FIG. 18 schematically shows an arrangement of a number of mode matrices MM1, MM2 whose modes are respectively optimized for improvement of the signal-to-noise ratios in different target regions. The antenna signals R, M and L can be connected via change-over switches U1, . . . U6 with the mode matrices MM1, MM2, . . . . The generated modes P1, S1, T1 and P2, S2, T2 are supplied to the mode outputs MP, MS, MT via the change-over switches U7, . . . U12.

Such an arrangement has the advantage that the mode matrices MM1, MM2, . . . do not have to be implemented such that they can be adjusted, but rather they can be simply realized mode matrices that are respectively specifically set with regard to their properties at a desired target region. The arrangement thus offers both flexibility in the selection of the target region and the possibility to be able to use simple technical realization forms.

FIG. 19 shows an exemplary complex assembly for use of a number of reception units 51A, 51B, 51N to receive MR response signals with an MR device. At least one output of each reception unit 51A, 51B, 51N is respectively connected with an input of a channel multiplexer 53. The channel multiplexer 53 selects, corresponding to the exposure to be implemented, at least one of the input signals and forwards this to the reception channel 55A of an analog-digital converter $ADC_1$ that is a connecting element between reception unit 55A and imaging unit 57 of the MR device. Depending on the capacity of the imaging unit 57, this has one or more reception channels 55A–55D.

The reception units 51A, 51B, 51N respectively have three (for example) linearly polarized local antennas 59A, 59B, 59C that partially overlap for decoupling, and that together form a local antenna arrangement. Given the formation of the primary mode, this means in the advantageous case (no noise correlation) an improvement by a factor of $n^{1/2}$ in the SNR. A number of such local antenna arrangements can be arranged in pairs parallel to one another, aligned to upper and lower sides of a body reception antenna.

Each of the antennas is connected with an adaptation network 61A, 61B, 61C that transforms the antenna impedance in a quasi-lossless manner into a value, with subsequently connected preamplifiers 63A, 63B, 63C providing a minimal noise contribution. This value is typically at approximately 50 Ohm.

The signal preamplifiers 61A, 61B, 61C are supplied with a direct voltage by the connecting combination network 65A and amplify the signal in an optimal manner with minimal inherent noise contribution.

The preamplified antenna signals $L_1$, $M_1$, $R_1$ and $L_2$, $M_2$, $R_2$ and $L_N$, $M_N$, $R_N$ are combined by the respective combination networks 65A, 65B, 65C into new modes $P_A$, $S_A$, $T_A$ and $P_B$, $S_B$, $T_B$ and $P_N$, $S_N$, $T_N$, respectively. All of these modes preferably are connected with the channel multiplexer 53. For the desired MR exposure the multiplexer 53 select the required modes and forwards them to one or more reception channels 55A–55D.

Instead of or in addition to the body reception antenna, a head antenna arrangement, for example, can also be connected to the channel multiplexer 53.

The combination networks can both be implemented directly in the respective unit of the antenna arrangements 59A–59C and can be implemented as a modular unit that connects to the unit.

FIG. 20 explains the target point selection in the primary mode formation. If a target point Z1 is selected in a acquisition region FOV of a local antenna arrangement, in the generation of an MR exposure 71 this target point Z1 is transferred directly to a point Z1' in the MR exposure 71.

In contrast to this, FIG. 21 shows the reference between the selection of a target point Z2 in the acquisition region FOV' of a PAT measurement with the acceleration factor of two. If, for example, the target point Z2 in the center of the overlap region 73 is selected in the PAT measurement, and the secondary mode is optimized such that this target region exhibits, in an accelerated imaging with an acceleration factor of 2, a maximal signal-to-noise ratio in the deconvolution of the PAT measurement the target point Z2 is located in both points Z2' and Z2" of the deconvoluted MR exposure 75.

The target point Z1 that is selected for optimization of the primary mode determines, for example, the improvement of the signal-to-noise ratio in a central region, in contrast to which the second target point Z2 for optimization of the secondary mode in the overlap region 73 (meaning in the edge areas) leads to an improvement of the signal-to-noise ratio.

Furthermore, it is possible for testing and measuring purposes to generate inverse mode matrices that, for example, reduce the modes back into the antenna signals. This enables a combination network spatially integrated into an antenna arrangement, for example with an imaging unit that is designed for antenna signals and not for modes, to be checked.

Finally, it should be noted that both the costs for reception channels and the image reconstruction time play a critical role in the topic of the reduction of the image acquisition time via PAT measurement. For this reason, it is preferable to scale the number of the antenna signals that are read in corresponding to the current acceleration factor of a PAT measurement. This saves time, due to the lesser quantity of data that is to be read in, and expenses, since fewer reception channels are required. For this reason, in the reception unit the antenna signals are not directly directed to the reception channels of an imaging unit, but rather they are first supplied to a combination network. This combination network generates, for example, modes of the type that a number R of these modes are already sufficient given an acceleration factor R in order to operate parallel imaging. If a larger number of modes are used, this leads to a further local improvement in the signal-to-noise ratio in the MR exposure. In other words, the transmitted information is prepared, by the inclusion of the additional element combination network in the signal path, such that a scalability of the subsequently connected hardware and operating performance is possible.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for forming at least two modes for a magnetic resonance imaging apparatus, comprising the steps of:
    receiving at least two magnetic resonance response signals respectively with at least two local antennas;
    generating a primary mode by combining said received magnetic resonance response signals in a first weighted linear combination, said primary mode corresponding to a magnetic resonance signal of an amplitude-controlled and phase-controlled group antenna exhibiting a first sensitivity distribution that is optimized for a target region within a detection volume of said local antennas;
    generating a secondary mode by combining said received magnetic resonance response signals in a second weighted linear combination, said secondary mode corresponding to a magnetic resonance signal of an amplitude-controlled and phase-controlled group antenna exhibiting a second sensitivity distribution that is different from said first sensitivity distribution in a phase coding direction of said response signals; and
    supplying said primary mode to a first reception channel of a magnetic resonance imaging unit and supplying said secondary mode to a second reception channel of said magnetic resonance imaging unit.

2. A method as claimed in claim 1 comprising generating said primary mode using said first weighted linear combination with a linear coefficient dependent on a geometric position of said local antennas relative to said target region.

3. A method as claimed in claim 1 comprising generating said primary mode with said first weighted linear combination having respective factors, selected from the group consisting of weighting factors and phase factors, applied to the respective signals from the local antennas, representing an influence of the target region on that local antenna selected from the group consisting of a distance of that local antenna from the target region and an angle of that local antenna relative to the target region.

4. A method as claimed in claim 1 comprising generating said primary mode with said first weighted linear combination having respective phase factors applied to said response signals representing a sensitivity of the local antenna, from which the respective response signal was received, in the target region relative to a phase of the magnetic resonance emission from said target region.

5. A method as claimed in claim 1 comprising generating a magnetic resonance image, exhibiting a signal-to-noise ratio, from said primary mode, and employing at least one coefficient in said first linear weighted combination that optimizes said signal-to-noise ratio of said image in said target region.

6. A method as claimed in claim 5 wherein said target region is a first target region, and comprising employing at least one coefficient in said second weighted linear combination so that a parallel imaging implemented with said primary mode and said secondary mode, with an acceleration factor of two, optimizes the signal to noise ratio in said image in a second target region.

7. A method as claimed in claim 1 comprising receiving at least three magnetic resonance response signals respectively from at least three local antennas, and comprising the additional step of generating a tertiary mode from a third weighted linear combination of said response signals, said tertiary mode corresponding to a magnetic resonance signal of an amplitude-controlled and phase-controlled group antenna that exhibits a third sensitivity distribution, that is different from said first sensitivity distribution and said second sensitivity distribution in said phase-coding direction.

8. A method as claimed in claim 7 comprising employing at least one coefficient in said third weighted linear combination that optimizes a signal-to-noise ratio in a further target region, different from said target region, in an image produced by parallel imaging with said primary, secondary and tertiary modes with an acceleration factor of 3.

9. A method as claimed in claim 7 comprising selecting a preliminary secondary mode and a preliminary tertiary mode that are orthogonal to each other and orthogonal to said primary mode, and generating said secondary mode as a linear combination of said preliminary secondary mode and said preliminary tertiary mode, to optimize a signal-to-noise ratio in a further target region, different from said target region, in an image produced by parallel imaging with said primary mode and said secondary mode with an acceleration factor of two.

10. A method as claimed in claim 1 comprising generating at least four magnetic resonance response signals from a number of local antennas that is at least four, up to a number of response signals equal to said number of local antennas, and for each additional response signal, forming one further mode by a further linear combination of said response signals, each further mode exhibiting a sensitivity distribution that is different from the respective sensitivity distributions of each of the other modes.

11. A method as claimed in claim 10 wherein at least two of said modes are orthogonal relative to each other.

12. A method as claimed in claim 1 comprising generating at least four magnetic resonance response signals from a number of local antennas that is at least four, up to a number of response signals equal to said number of local antennas, and for each additional response signal, forming one further mode by a further linear combination of said response signals, each further mode optimizing a signal-to-noise ratio in a selected further target region, different from said target region, in an image obtained by parallel imaging with all of said modes with an acceleration factor corresponding to the number of said modes.

13. A method as claimed in claim 12 wherein at least two of said modes are orthogonal relative to each other.

14. A method as claimed in claim 1 comprising selecting a region of interest in a magnetic resonance examination as said target region.

15. A method as claimed in claim 1 wherein said at least two local antennas form an antenna arrangement having a field of view defining a detection volume in an examination subject, and comprising selecting a region in said detection volume as said target region that, due to said antenna arrangement, exhibits a lower sensitivity in at least one of said first and second sensitivity distributions.

16. A method as claimed in claim 1 comprising selecting said target region by selecting at least one coefficient in at least one of said first weighted linear combination and said second weighted linear combination.

17. A method for providing modes for magnetic resonance imaging in a magnetic resonance imaging apparatus, comprising the steps of:
providing at least two local antennas having, in combination, a field of view that defines a detection volume of an examination subject, and substantially simultaneously receiving one magnetic resonance response signal with each of said local antennas, said response signal comprising signal components that are spatially associated with respective regions in said detection volume;
generating a primary mode by combining said magnetic resonance response signals in a first weighted linear combination, said primary mode corresponding to a magnetic resonance signal of an amplitude-controlled and phase-controlled group antenna exhibiting a first sensitivity distribution that is optimized for a target region within said detection volume of said local antennas;
generating a secondary mode by combining said response signals in a second weighted linear combination, said secondary mode corresponding to a magnetic resonance signal of an amplitude-controlled and phase-controlled group antenna exhibiting a second sensitivity distribution that is different from said first sensitivity distribution in a phase coding direction of said response signals; and
supplying said primary mode to a first reception channel of a magnetic resonance imaging unit and supplying said secondary mode to a second reception channel of said magnetic resonance imaging unit.

18. A method as claimed in claim 17 comprising supplying said primary mode to said reception channel and processing said primary mode in said imaging unit to generate a magnetic resonance image.

19. A method as claimed in claim 17 comprising processing said primary mode in said imaging unit to generate a first magnetic resonance image including said target region, and processing said primary and secondary modes in said imaging unit with a parallel imaging technique to generate a second magnetic resonance image including said target region.

20. A method as claimed in claim 19 comprising providing at least three local antennas, each receiving said response signal, and generating a tertiary mode with a third weighted linear combination of the respective response signals received by said three antennas, said tertiary mode corresponding to a magnetic resonance signal of an amplitude-controlled and phase-controlled group antenna exhibiting a third sensitivity distribution that is different from said first sensitivity distribution and said second sensitivity distribution in said phase coding direction, and processing said primary, secondary and tertiary modes in said imaging unit using a parallel imaging technique to generate a third magnetic resonance exposure including said target region.

21. A method as claimed in claim 20 comprising providing at least four local antennas, each receiving said response signal, and generating at least one further mode with a further linear combination of the response signals respectively received by said at least four local antennas, said at least one further mode exhibiting a sensitivity distribution that is different from the respective sensitivity distributions of all other modes, and processing all of said modes in said imaging unit in respective reception channels, using a parallel imaging technique, to generate a further magnetic resonance exposure including said target region.

22. A reception unit for a magnetic resonance imaging apparatus, comprising:
at least two local antennas; and
a combination network to which said at least two local antennas are separately connected, said combination unit generating at least two different modes from respectively different linear combinations of antenna signals respectively received by said at least two local antennas, said combination network having at least two outputs at which at least two of said at least two different modes are respectively present.

23. A reception unit as claimed in claim 22 wherein said combination unit produces said at least two modes with respectively different sensitivity distributions that differ in a phase coding direction.

24. A reception unit as claimed in claim 22 wherein said combination network applies a linear coefficient to one of said antenna signals, in said linear combination.

25. A reception unit as claimed in claim 24 wherein said combination unit employs a quantity selected from the group consisting of weighting factors and phase shifts, as said linear coefficient.

26. A reception unit as claimed in claim 22 wherein said combination unit generates one of said modes as a mode corresponding to a signal of an antenna having a geometry to receive a spatial field structure that is not individually receivable with any one of said local antennas.

27. A reception unit as claimed in claim 22 wherein the respective signals from the local antennas exhibit different run-times, and wherein said combination unit comprises at least one phase shifter for compensating for said run time differences.

28. A reception unit as claimed in claim 22 wherein said combination network comprises a signal combination unit having two inputs and two outputs, with respective signals from said at least two antennas being supplied to respective inputs, the signals at the respective inputs being added with a first linear coefficient without a phase difference to produce a signal at one of said outputs and being added with a second linear coefficient with a phase difference to produce a signal at the other of said outputs.

29. A reception unit as claimed in claim 28 wherein said phase difference is selected from the group consisting of 60°, 90°, 120° and 180°.

30. A reception unit as claimed in claim 22 comprising at least three local antennas and wherein said combination network comprises a first signal combination unit having two inputs and two outputs at a second signal combination unit having two inputs and two outputs, with two of the antenna signals respectively from said at least three local antennas being supplied to the respective inputs of the first signal combination unit, a first of said outputs of said first signal combination unit being connected to an output of said combination network at which a first of said modes is present, and a second of said outputs of said first signal combination unit being connected with a first of the inputs of the second signal combination unit, and a third of said antenna signals of said at least local antennas being supplied to a second of the inputs of said second signal combination unit, and a first of the outputs of said second signal combination unit being connected with a further output of said combination network at which a second of said modes is present.

31. A reception unit as claimed in claim 30 wherein a second of the outputs of said second signal combination unit is connected to a third output of the combination network.

32. A reception unit as claimed in claim 30 wherein said at least three local antennas include two laterally arranged local antennas, the respective signals received thereby being supplied to the first and second of the inputs of said first signal combination unit and a third local antenna disposed between the laterally arranged local antennas, said third antenna generating said third antenna signal, and wherein said first signal combination unit adds the respective signals of said two laterally arranged local antennas with a weighting factor of $2^{-1/2}$ without a phase difference to produce a secondary mode and adds the signals of the two laterally arranged local antennas with a weighting factor of $2^{-1/2}$ and with a phase difference of 180° to produce said signal at the second of the outputs of said first signal combination unit, and wherein said second signal combination unit adds the signal from the second of the outputs of said first signal combination unit with said third antenna signal from said third local antenna with a weighting factor of $2^{-1/2}$ and with a phase difference of 90° and a weighting factor of $2^{1/2}$, to generate a tertiary mode, and adds said signal from the second of the outputs of said first signal combination unit with said third antenna signal from said third local antenna with a phase difference of −90° to generate a primary mode.

33. A reception unit as claimed in claim 30 wherein said at least three local antennas include two laterally arranged local antennas, the respective signals received thereby being supplied to the first and second of the inputs of said first signal combination unit and a third local antenna disposed between the laterally arranged local antennas, said third antenna generating said third antenna signal, and wherein said first signal combination unit adds the respective signals of said two laterally arranged local antennas with a weighting factor of $2^{-1/2}$ and with a phase difference of 60° to produce a secondary mode and adds the signals of the two laterally arranged local antennas with a weighting factor of $2^{-1/2}$ and with a phase difference of 120° to produce said signal at the second of the outputs of said first signal combination unit, and wherein said second signal combination unit adds the signal from the second of the outputs of said first signal combination unit with said third antenna signal from said third local antenna with a phase difference of 60° and a weighting factor of $2^{1/2}$, to generate a primary mode, and adds said signal from the second of the outputs of said first signal combination unit with said third antenna signal from said third local antenna with a weighting factor of $2^{-1/2}$ and with a phase difference of 120° to generate a tertiary mode.

34. A reception unit as claimed in claim 30 wherein said first and second signal combination units are substantially reflection-free.

35. A reception unit as claimed in claim 30 wherein said first and second signal combination units are substantially lossless.

36. A reception unit as claimed in claim 30 wherein one of said first and second signal combinations is a hybrid unit.

37. A reception unit as claimed in claim 36 wherein said hybrid unit is a four-port coupler.

38. A reception unit as claimed in claim 22 wherein at least one of said outputs of said combination network is connected to a reception channel of a local antenna selection unit.

* * * * *